(12) United States Patent
Hawes et al.

(10) Patent No.: US 7,989,788 B2
(45) Date of Patent: *Aug. 2, 2011

(54) DETERMINING POSITION OF A MEDIA PAGE USING A SLOT IN THE IMAGING DRUM

(75) Inventors: Peter J. Hawes, Burnaby (CA); Allan Warnes, North Vancouver (CA)

(73) Assignee: Eastman Kodak Company, Rochester, NY (US)

( * ) Notice: Subject to any disclaimer, the term of this patent is extended or adjusted under 35 U.S.C. 154(b) by 308 days.

This patent is subject to a terminal disclaimer.

(21) Appl. No.: 12/326,998

(22) Filed: Dec. 3, 2008

(65) Prior Publication Data

US 2010/0133451 A1    Jun. 3, 2010

(51) Int. Cl.
*G01N 21/86* (2006.01)

(52) U.S. Cl. ................. 250/559.36; 250/599.3

(58) Field of Classification Search ............. 250/559.36, 250/559.3, 559.01, 559.16, 559.29, 559.4, 250/221, 208.1, 557, 570, 205, 206, 548, 250/559.37, 559.04–559.08, 559.12–559.15; 101/484–486, 463.1, 477, 401.1; 355/67, 355/68, 77; 347/5, 16, 19; 358/504, 296, 358/302, 3.24

See application file for complete search history.

(56) References Cited

U.S. PATENT DOCUMENTS

| | | | | |
|---|---|---|---|---|
| 5,466,945 A * | 11/1995 | Brickell et al. | ........... | 250/559.12 |
| 6,815,702 B2 * | 11/2004 | Kiermeier et al. | ....... | 250/559.36 |
| 7,084,386 B2 * | 8/2006 | Bernardini et al. | ........... | 250/216 |
| 7,456,379 B2 | 11/2008 | Neufeld et al. | | |
| 2005/0201808 A1 * | 9/2005 | Barry et al. | ................... | 400/679 |
| 2006/0005728 A1 * | 1/2006 | Neufeld et al. | ............... | 101/485 |
| 2008/0236426 A1 * | 10/2008 | Cummings et al. | ........ | 101/463.1 |
| 2010/0132574 A1 * | 6/2010 | Hawes et al. | ................. | 101/477 |

\* cited by examiner

*Primary Examiner* — Thanh X Luu
*Assistant Examiner* — Jennifer Bennett
(74) *Attorney, Agent, or Firm* — Nelson Adrian Blish

(57) ABSTRACT

A method for determining a position of a mechanical edge of a reference edge of a sheet of recording media relative to a first edge of a drum slot in a cylindrical surface of an imaging drum, the method includes mounting the sheet of recording media on the imaging drum in an orientation wherein the reference edge extends along the cylindrical surface of the imaging drum in a substantially axial direction and wherein the reference edge extends over the first edge of the drum slot; establishing at least one acute apex diffuse light source in the slot; capturing at least one digital camera image of the reference edge and the at least one acute apex diffuse light source; and determining from the at least one digital camera image a location of at least one point on the mechanical edge.

6 Claims, 16 Drawing Sheets

DETERMINING POSITION OF A MEDIA PAGE USING A SLOT IN THE IMAGING DRUM

CROSS REFERENCE TO RELATED APPLICATIONS

Reference is made to commonly-assigned, copending U.S. patent application Ser. No. 12/326,953, filed Dec. 3, 2008, entitled IMPROVED PRINTING PLATE REGISTRATION, by Cummings et al.; copending U.S. patent application Ser. No. 12/326,968, filed Dec. 3, 2008, entitled IMPROVED PRINTING PLATE REGISTRATION, by Hawes et al., the disclosures of which are incorporated herein.

FIELD OF THE INVENTION

The invention relates to printing and, in particular to providing registered images on printing plates.

BACKGROUND OF THE INVENTION

Printing plates may be imaged on a plate-making machine and then transferred to a printing press. Once on the printing press, the images from the printing plates are transferred to paper or other suitable substrates. It is important that images printed using a printing press be properly aligned with the substrate on which they are printed.

One conventional technique of aligning the printing plate on a press cylinder of a printing press involves using a reference edge and an orthogonal edge reference point of the printing plate to align the printing plate on a punching apparatus to form registration features (e.g. registration openings) in the printing plate. The printing plate may then be aligned on a press cylinder of the printing press with registration pins that project through each of the registration features. Needless to say, the images formed on the printing plate by a plate-making machine must be properly registered with the formed registration features.

FIG. 1 is a schematic depiction of a conventional plate-making machine 10 (also known as plate-setter 10) having an imaging drum 12 on which a printing plate 14A may be mounted. Plate-setter 10 has an imaging head 16 which can impart an image onto printing plate 14A. In this case, imaging head 16 is axially movable relative to imaging drum 12 (i.e. along the directions parallel to the axis of imaging drum 12 indicated by double-headed arrow 24). Imaging head 16 typically includes a radiation source (not shown), such as a laser, which emits one or more beams of laser radiation capable of imparting an image onto printing plate 14A. A controller 20 controls imaging head 16 and its associated radiation source in accordance with print image data stored in a memory 22, so as to image printing plate 14A. The Trendsetter™ plate-setters available from Eastman Kodak Company represent examples of plate making machines having the basic configuration shown in FIG. 1.

FIG. 2A shows imaging drum 12 of plate-setter 10 in greater detail. Imaging drum 12 has a plurality of registration pins 18A, 18B, 18C which project from its cylindrical surface 13. In this case, imaging drum 12 comprises three registration pins 18A, 18B, 18C, which may be offset slightly from one another around the circumference of imaging drum 12 to enable the registration of different printing plates. Different printing plates can include printing plates having different sizes. As shown in FIG. 2A, a reference edge 15A of printing plate 14A is brought into engagement with two registration pins 18A, 18B to orient printing plate 14A with imaging drum 12. Typically, printing plate 14A is rectangular in shape and reference edge 15A may be one of the "long" edges of printing plate 14A (as depicted in FIG. 2A). In this case, the shorter, orthogonal edge 19A of printing plate 14A extends around the circumference of imaging drum 12. In some cases a "long" edge of a printing plate can extend around the circumference of imaging drum 12. An edge detector (not shown) detects the position of a third reference point 11 on orthogonal edge 19A of printing plate 14A. Third reference point 11 is located at a fixed circumferential distance 23 relative to at least one of registration pins 18A, 18B, and 18C and is used to determine a registration position of printing plate 14A. Printing plate 14A is clamped onto imaging drum 12 using any suitable clamping system (not shown). Typically, clamping systems clamp regions of printing plate 14A in vicinity to reference edge 15A and in vicinity to an opposing edge of printing plate 14A (not shown) that is substantially parallel to reference edge 15A.

With printing plate 14A clamped and registered, imaging drum 12 is rotated about its axis in either or both of the main-scan directions indicated by arrow 26, while imaging head 16 is moved axially relative to imaging drum 12 (i.e. in the sub-scan directions indicated by arrow 24) while scanning radiation beams onto mounted printing plate 14A. Controller 20 controls the relative movement of imaging head 16 and imaging drum 12 and controls the radiation source in imaging head 16 in accordance with print image data 27 to impart an print image 17 onto printing plate 14A. In this case, it is desired that an edge 17A of print image 17 be created substantially parallel to reference edge 15A. The region 25 of printing plate 14A that is adjacent to reference edge 15A and the region (not shown) that is adjacent to the opposing edge of printing plate 14A are covered in part by the clamping system and are not imaged.

After being imaged on plate-setter 10, printing plate 14A is punched in a punching apparatus 50 as shown in FIG. 2B. Printing plate 14A is registered on punch table 52 of punching apparatus 50 by bringing it into engagement with two registration surfaces 18A', 18B' on its reference edge 15A and registration surface 11' on its orthogonal edge 19A. Punch table 52 comprises a third registration surface 11' that is located a circumferential distance 23 from at least one of registration pins 18A', and 18B'. With printing plate 14A registered to surfaces 18A', 18B', 11', punching apparatus 50 creates a number of registration features (not shown) in printing plate 14A. The registration features created by punching apparatus 50 may have a wide variety of shapes, sizes suitable for engagement with press cylinder of a printing press.

Once printing plate 14A is punched, reference edge 15A and the opposing edge (i.e. parallel to reference edge 15A) of printing plate 14A may be bent (not shown). As shown in FIG. 2C, printing plate 14A is then mounted on a press cylinder 62 of a printing press. A clamping system (not shown) which is used to mount printing plate 14A to press cylinder 62, may comprise registration pins which project through the registration features punched in printing plate 14A to secure printing plate 14A to press cylinder 62 in correct alignment. The clamping system may also use the bent edges of printing plate 14A (if present) to secure printing plate 14A to press cylinder 62. When printing plate 14A is securely mounted to press cylinder 62, the clamping system overlaps non-imaged region 25 of printing plate 14A (i.e. adjacent to reference edge 15A) and the non-imaged region adjacent the opposing edge of printing plate 14A (i.e. the edge parallel to reference edge 15A). In this manner, the clamping system of printing press (not shown) does not impede print image 17 on printing plate 14A. Print image 17 is then transferred to a substrate (not shown) by applying ink to printing plate 14A and rolling press cylinder 62 to bring inked print image 17 into contact with the substrate.

There are several problems associated with this conventional registration process. The two registration pins 18A, 18B are mounted in predetermined fixed positions and do not necessarily match the position and orientation of reference surfaces 18A' and 18B' on punch table 52. This can lead to inaccuracies in the formation of the various registration features in proper alignment with the images formed on printing plate 14A. For example, factors such as wavy printing plate edges and plate edge burrs can cause registration problems when each of the imaging actions taken by a plate-setter 10 and the registration feature forming actions taken by punching apparatus 50 employ different sets of registration surfaces. There are also reliability challenges in consistently and accurately loading the plate into contact with the registration features. It is also difficult to define sets of pins that allow a wide range of plate formats to be imaged whilst not interfering with one another.

Image sensors such as CCD cameras have been proposed to improve these registration problems. For example, in commonly-assigned U.S. Pat. No. 7,456,379 (Neufeld et al.) an edge detection system is described, based on using a CCD camera to image the edges of a printing plate perpendicular to the sub-scan direction. Based on the information so obtained, the image data is then adjusted to compensate for any misalignment between the plate and the drum on which it is loaded. In commonly-assigned U.S. Patent Application Publication No. 2008/0236426 (Cummings et al.) printing plate imaging techniques are described in which the locations of at least two points on a reference edge of printing plate mounted on an imaging drum are determined. The locations of two or more points are used to determine a transformation that is applied to image data to yield transformed image data which is in turn used to image the printing plate. The locations of the points can be determined by use of backlighting to avoid errors encountered in illuminating from the top.

There is a need in the printing industry for methods and apparatus capable of consistently and automatically determining an outer mechanical edge of a printing plate that is to be imaged.

There is a need in the printing industry for methods and apparatus capable of consistently and automatically determining an outer mechanical edge of a printing plate that is to undergo imaging forming actions.

There is a need in the printing industry for methods and apparatus capable of enhanced determination of an outer mechanical edge of printing plate with an image sensor.

SUMMARY OF THE INVENTION

Briefly, according to one aspect of the present invention a method for determining a position of a mechanical edge of a reference edge of a sheet of recording media relative to a first edge of a drum slot in a cylindrical surface of an imaging drum, the method includes mounting the sheet of recording media on the imaging drum in an orientation wherein the reference edge extends along the cylindrical surface of the imaging drum in a substantially axial direction and wherein the reference edge extends over the first edge of the drum slot; establishing at least one acute apex diffuse light source in the slot; capturing at least one digital camera image of the reference edge and the at least one acute apex diffuse light source; and determining from the at least one digital camera image a location of at least one point on the mechanical edge.

BRIEF DESCRIPTION OF THE DRAWINGS

In the drawings which illustrate non-limiting embodiments of the invention.

DETAILED DESCRIPTION OF THE INVENTION

Throughout the following description, specific details are set forth in order to provide a more thorough understanding of the invention. However, the invention may be practiced without these particulars. In other instances, well known elements have not been shown or described in detail to avoid unnecessarily obscuring the invention. Accordingly, the specification and drawings are to be regarded in an illustrative, rather than a restrictive, sense.

Figure 1:
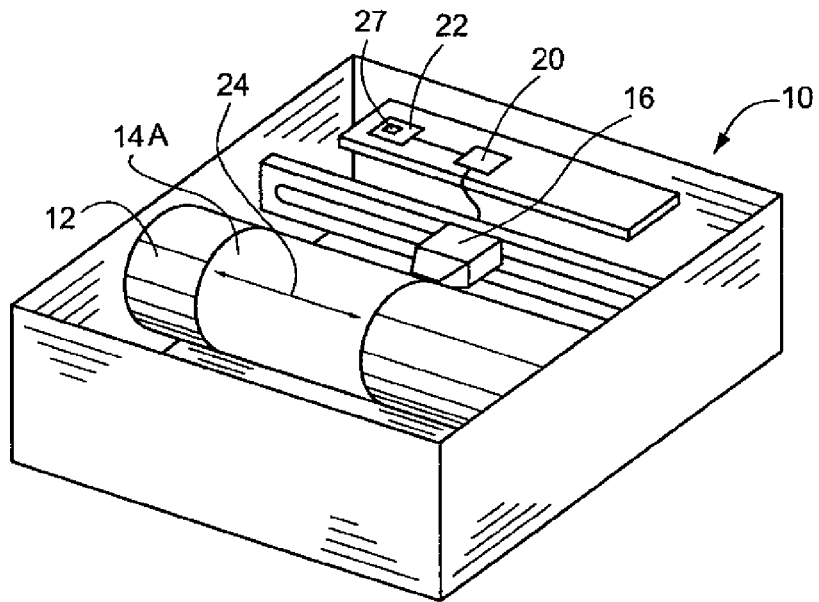
FIG. 1 is a prior art schematic diagram of a prior art external drum-type plate-making machine.
Figure 2A:
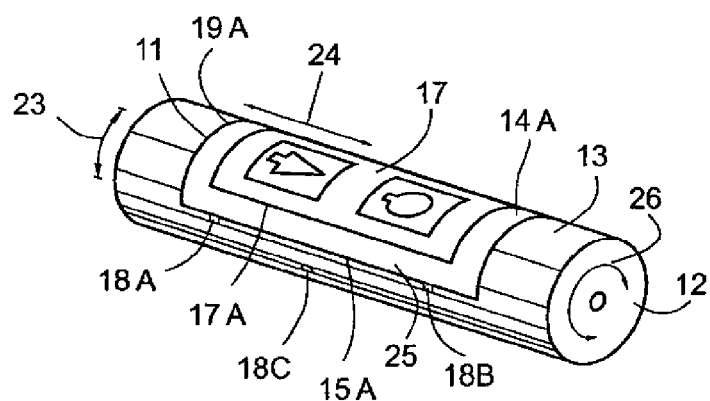
FIG. 2A is an isometric depiction of a printing plate mounted to a drum in the prior art plate-making machine of FIG. 1.
Figure 2B:
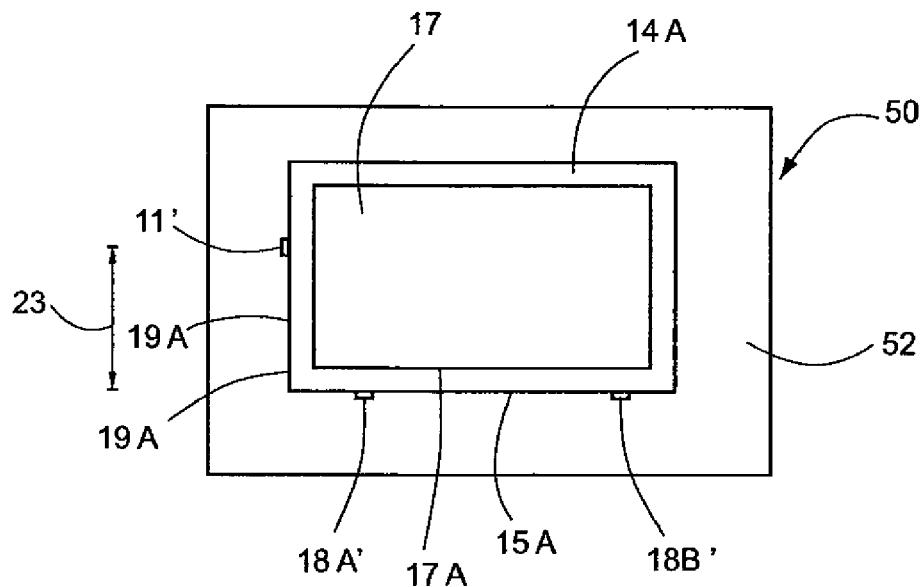
FIG. 2B is a top elevation view of an imaged printing plate in a prior art punching apparatus.
Figure 2C:
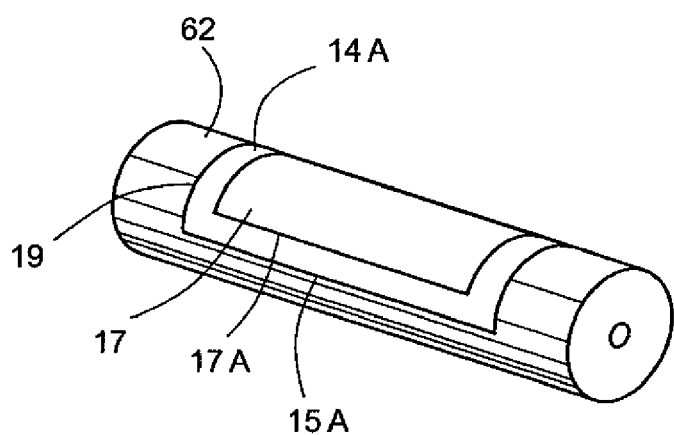
FIG. 2C is an isometric view of an imaged printing plate mounted on a press cylinder of a prior art printing press.
Figure 3:
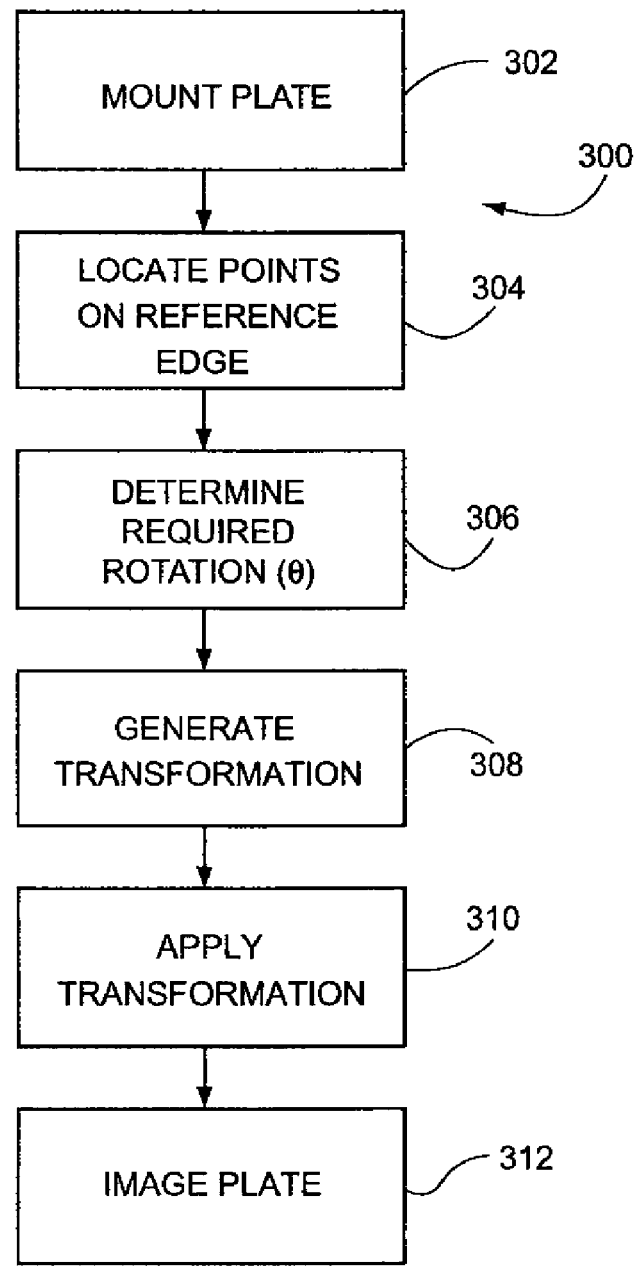
FIG. 3 is a flow chart illustrating one embodiment of a method for imaging a printing plate according to the invention.
Figure 4A:
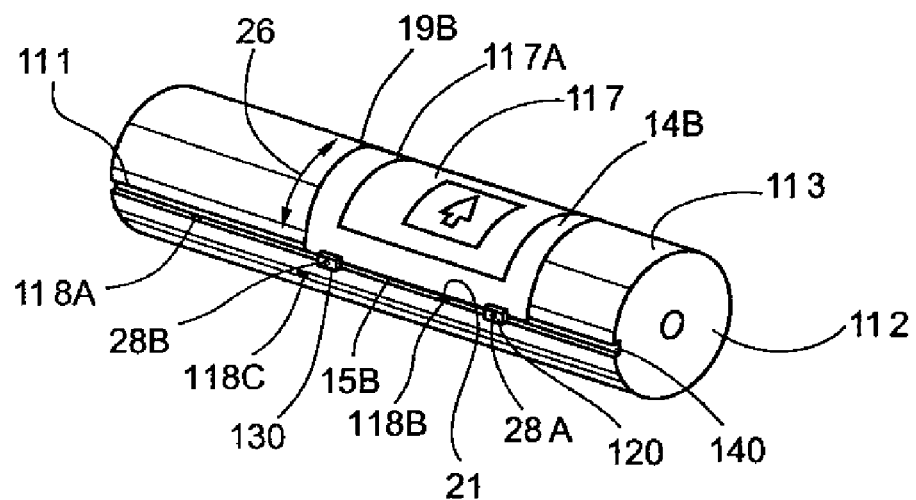
FIG. 4A is an isometric depiction of a printing plate mounted to a drum of a plate-making machine according to a particular embodiment of the invention.

FIG. 3 shows a flow chart representing a method 300 for registering and imparting a print image 117 (see FIG. 4A) onto a printing plate 14B according to an example embodiment of the invention. FIG. 4A depicts printing plate 14B on support surface 113 of imaging drum 112 of a plate-setter 110, shown in FIG. 5, according to an example embodiment of the present invention. In this example embodiment, support surface 113 is a cylindrical surface of imaging drum 112. Method 300 includes block 302, which comprises mounting printing plate 14B on imaging drum 112 of a plate-setter 110. Plate-setters incorporating an imaging drum such as that shown in FIG. 4A are typically referred to as external drum-type plate-setters.

In this example embodiment of the present invention, printing plate 14B is mounted to support surface 113 of imaging drum 112 with its shorter edge 19B extending generally along a direction that is aligned to a circumferential or main-scan direction 26 around imaging drum 112. This is for the purposes of illustration and it is understood that the various printing plates can also be aligned with their longer edges extending around drum 112. As shown in FIG. 4A, the longer edge 15B of printing plate 14B extends generally along a sub-scan direction that is aligned with an axial direction of imaging drum 112. Since it is desired that edge 15B be used as a reference for subsequent image forming actions, edge 15B is herein referred to as reference edge 15B.

In this illustrated embodiment, reference edge 15B is clamped by at least two clamps 120 and 130 to imaging drum 112. To assist in positioning printing plate 14B, printing plate 14B may optionally touch at least one of optional location surfaces 118A, 118B, 118C positioned on imaging drum 112 to contact one or more reference points 21 on reference edge 15B. Location surfaces 118A, 118B, 118C can be, but are not limited to, reference pins. In this illustrated embodiment, location surface 118B is contacted. It is understood that different printing plates can contact different ones or different combinations of location surfaces 118A, 118B, and 118C. In various example embodiments, various ones of location surfaces 118A, 118B, and 118C can be used to roughly position reference edge 15B of printing plate 14B with respect to clamps 120 and 130. In this illustrated embodiment, reference edge 15B touches at least one of reference pins 118A, 118B, and 118C to assist in positioning printing plate 14B such that its reference edge 15B protrudes over drum slot 140 which is located on imaging drum 112. It is to be understood that various other reference points identified on reference edge 15B need not contact various ones of location surfaces 118A, 118B, and 118C, or correspond to points of contact on reference edge 15B.

The two clamps 120 and 130, described in more detail below, hold printing plate 14B on support surface 113 of imaging drum 112 of the plate-setter 110 and are themselves positioned relative to drum slot 140 in a manner that leaves at least a portion of reference edge 15B exposed through each of the two clamps 120 and 130 as described in more detail below. The two clamps 120 and 130 hold printing plate 14B on support surface 113 of imaging drum 112 in the vicinity of at least two reference points 28A and 28B on reference edge 15B. Each of the two clamps 120 and 130 may be individual clamps or may be segments of a single larger clamp. The single large clamp may extend along the whole length, or substantially the whole length, of imaging drum 112. In this illustrated embodiment, clamps 120 and 130 are located in fixed predetermined positions. In other example embodiments of the invention, various portions of reference edge 15B can be exposed between adjacent clamps or clam segments of the two clamps 120 and 130.

In block 304 of FIG. 3, the positions of the two reference points 28A, 28B on reference edge 15B are determined. Reference points 28A, 28B may be found using various techniques described in detail below.

Figure 4B:
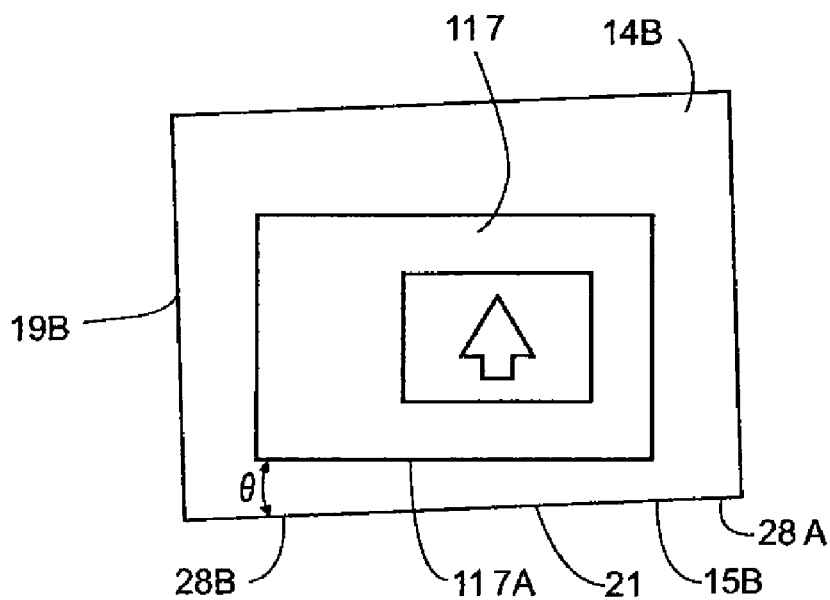
FIG. 4B shows a plan view of an imaged printing plate mounted in a skewed orientation.

FIG. 4B shows a plan view of imaged printing plate 14B that has been mounted in a skewed orientation with respect to an axis of imaging drum 112. If the skew is not addressed, print image 117 may be imparted onto printing plate 14B such that an edge 117A of print image 117 may form an angle θ with respect to reference edge 15B. The amount of skew represented by angle θ has been exaggerated in FIG. 4B for clarity and may be less or more than the angle shown. Referring back to FIG. 3, in block 306 the locations of the two reference points reference 28A and 28B are used to determine angle θ by which print image 117 should be rotated to properly align edge 117A of print image 117 with reference edge 15B. In block 308, the rotation angle θ determined in block 306 is used to generate a transformation to be applied to print image data. The transformation may combine rotation and translation to map each image point in the print image data to a transformed image point.

The transformation is applied to print image data in block 310 of FIG. 3 to produce transformed image data. The transformation may be determined (in block 308) and applied to print image data (in block 310) by a data processor at the plate-setter 110. For example, a processor in a controller 122 of the plate-setter 110 may determine the transformation from data provided by edge detecting sensors and apply the transformation to print image data.

In block 312 of FIG. 3, the transformed print image data is used by controller 122 to drive imaging head 116 and its associated radiation source, so that print image 117 is imparted on printing plate 14B. In this illustrated embodiment, imaging head 116 moves in the axial sub-scan directions (see arrow 24 of FIG. 5) to impart print image 117 onto printing plate 14B while imaging drum 112 rotates in the main-scan directions (see arrow 26 of FIG. 5). To the extent that the various edges of printing plate 14B need to be known, they can be determined, for example, by the method of commonly-assigned U.S. Pat. No. 7,456,379.

Print image 117 imparted onto printing plate 14B will have an edge 117A that is aligned with reference edge 15B of printing plate 14B. In the embodiment shown in FIG. 5, edge 117A is shown as perpendicularly aligned with reference edge 15B. In some example embodiments, print image 117 imparted onto printing plate 14B may have some other desired registration relative to reference edge 15B. A given desired registration may be repeated for other associated printing plates made in the plate-setter 110 to assure registration among all the associated plates when mounted on a printing press.

Figure 5:
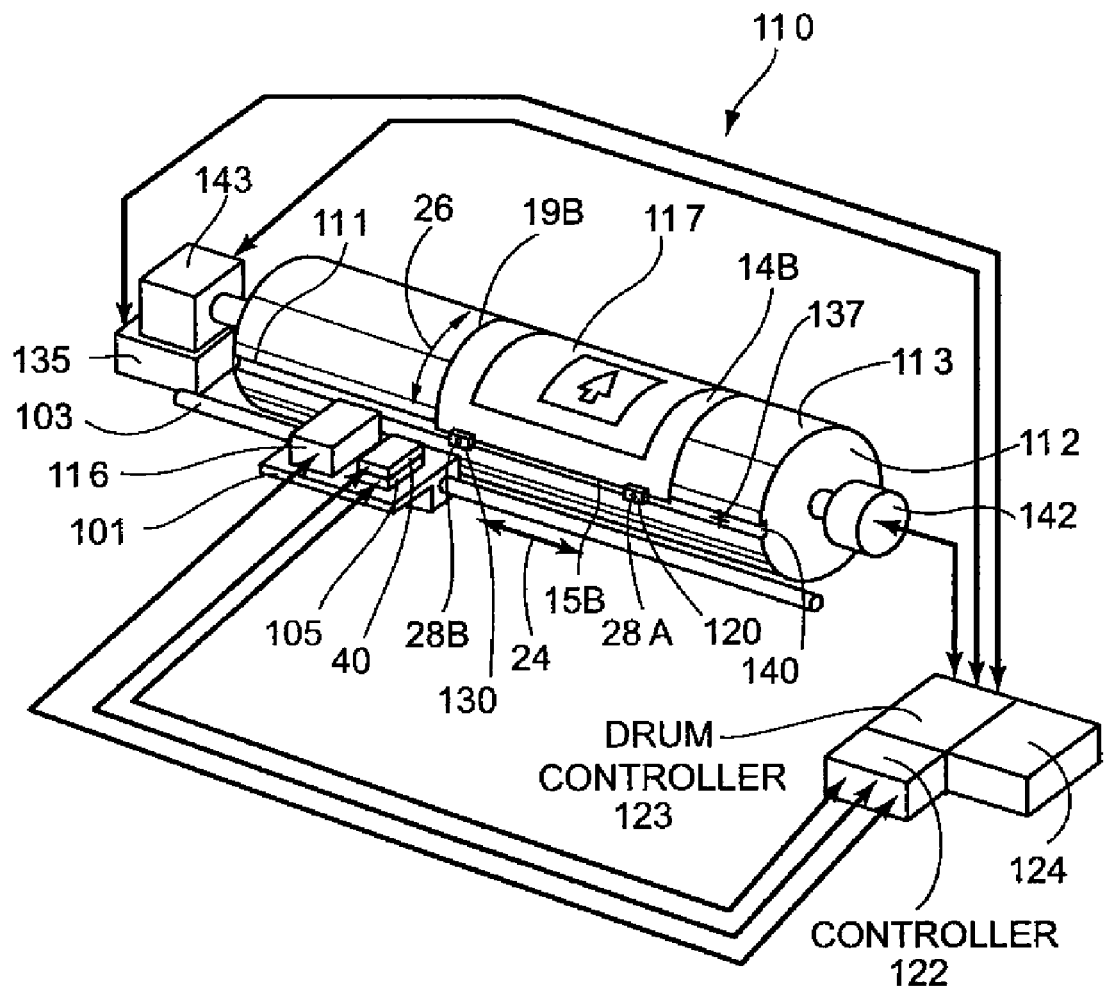
FIG. 5 is a schematic illustration of a plate-making machine according to one embodiment of the invention.

Various sensors can be used to detect the two reference points 28A and 28B on reference edge 15B. As schematically shown in FIG. 5, digital camera 40 is affixed to carriage 101 of plate-setter 110. Digital camera 40 includes one or more image sensors which can include a CCD sensor or a CMOS sensor for example. Carriage 101 moves along lead screw 103 in a sub-scan direction given by arrow 24. Digital camera 40 can be located with a known position and orientation relative to imaging drum 112. In FIG. 5, carriage 101 is shown in a position relative to imaging drum 112 that allows the accurate detection of second reference point 28B in particular. In this illustrated embodiment, an illumination source 105 is affixed to digital camera 40 and illuminates reference edge 15B through channels in one of clamps 120 and 130.

In this example embodiment, digital camera 40 captures digital images of reference edge 15B through channels in at least two clamps 120 and 130 which are located in the vicinity of reference points 28A, 28B on reference edge 15B (described in more detail below in FIG. 6). In one example embodiment, backlit edge techniques as described below are employed during the various image capture actions. Illumination source 105 can be an LED or other suitable light source. In FIG. 5, illumination source 105 is shown in a position to illuminate second reference point 28B through clamp 130 in particular. The images are processed to identify reference edge 15B and to accurately determine the locations of each of the two or more reference points 28A, 28B on reference edge 15B. A line detection algorithm may be used to locate reference edge 15B at each of the two reference points 28A and 28B. A straight line may be fitted to the located reference edge 15B. The positions of the two or more reference points 28A, 28B on reference edge 15B may be determined from the fitted line.

The two clamps 120 and 130 hold printing plate 14B on support surface 113 of imaging drum 112 in a manner that allows illumination source 105 to illuminate reference edge 15B through channels or illumination baffles in each of the two clamps 120 and 130 (described in more detail below in FIG. 6), and that allows digital camera 40 to capture images of parts of reference edge 15B through openings in the two clamps 120 and 130 located at reference points 28A, 28B on reference edge 15B.

In the embodiment shown in FIG. 5, plate-setter 110 includes an imaging head 116 that is affixed to movable carriage 101. Plate-setter 110 also includes mutually affixed illumination source 105 and digital camera 40. In other embodiments of the present invention, illumination source 105 and/or digital camera 40 may be affixed to imaging head 116. In other embodiments, digital camera 40, illumination source 105, and imaging head 116 may be variously affixed to one another, or not, or may travel along sub-scan direction 24 independent of one another. In yet other embodiments of the invention, one or both of digital camera 40 and illumination source 105 may be affixed to a structure other than moveable carriage 101. A digital camera with a relatively small field of view may be employed. A digital camera 40 that may employ a small field of view includes the Black and White Ultra-Miniature Camera, Model WDH-2500, manufactured by the Weldex Corporation. In this embodiment of the present invention, digital camera 40 can be moved over a larger sub-scan distance than the field of view of digital camera 40 to find various points along reference edge 15B where printing plate 14B is clamped by the two clamps 120 and 130. Illumination source 105 and digital camera 40 may be employed to capture images of the two reference points 28A, 28B on reference edge 15B. In other embodiments of the present invention, illumination source 105 and digital camera 40 may be employed to capture digital camera images of various points along the reference edge of each of a plurality of printing plates mounted on imaging drum 112. In other embodiments of the present invention, illumination source 105 illuminates a region that includes at least a part of reference edge 15B associated with least one point found on reference edge 15B. At least one point may correspond to one or more of the two or more reference points 28A and 28B.

In yet other embodiments of the present invention, plate-setter 110 may include a plurality of imaging heads 116. Each of the plurality of imaging heads 116 can be used to image at least one of a plurality of printing plates mounted on imaging drum 112. A separate digital camera 40 and illumination source 105 may be associated with each of the plurality of imaging heads 116 and be used to capture digital camera images of various points along the reference edge of a corresponding printing plate that is imaged by a given imaging head 116.

In preferred embodiments of the present invention, the digital images captured by digital camera 40 may be analyzed by one or more image data processors (not shown) to identify reference edge 15B and to determine the locations of two reference points 28A and 28B on reference edge 15B. Controller 122 may include the one or more image data processors. Controller 122 may determine the location of two reference points 28A and 28B and determine the alignment of printing plate 14B relative to imaging drum 112. Controller 122 may provide the necessary instructions to impart print image 117 onto printing plate 14B. When the locations of two reference points 28A and 28B on reference edge 15B are determined, print image 117 can be imparted onto printing plate 14B in alignment with the determined two reference points 28A and 28B. Controller 122 may include a processor to adjust print image data to produce adjusted print image data that aligns print image 117 on printing plate 14B relative to at least two reference points 28A and 28B. A line detection algorithm may be used to locate reference edge 15B in each of the captured digital camera images. A best-fit straight line may be fitted to the located reference edge 15B. The positions of the two or more reference points 28A, 28B on reference edge 15B may be determined from the fitted line. Referring back to FIG. 3, controller 122 may determine the necessary transformation in accordance with the determined positions of reference points 28A and 28B in block 308. The transformation is applied to print image data in block 310 to produce transformed print image data. The transformed print image data is then communicated to imaging head 116 to impart print image 117 in the desired alignment with reference edge 15B.

To determine the alignment of printing plate 14B relative to imaging drum 112 as well as drum transformation for print image data, the one or more image data processors requires positional information of the captured camera data of the reference points 28A and 28B. The required positional information typically includes sub-scan positional information and main-scan positional information.

The sub-scan positions of reference points 28A and 28B may be determined in part from the sub-scan positional coordinates of the digital camera 40 as it captures images at the reference points. Carriage 101 typically moves axially in synchronism with the rotation of imaging drum 112. Positional control of carriage 101 may be accomplished by numerous methods known in the art. Sub-scan positional calibration of digital camera 40 may be accomplished by several methods. One method may include capturing digital camera images of a feature incorporated in the surface of imaging drum 112; the sub-scan positional coordinates of the feature being known. Another method may include additionally detecting a specific reference point on reference edge 15B by another means such as a laser. For example, such a laser can be used to emit non-image forming radiation beams which can be employed during focusing actions. The sub-scan position detected by digital camera 40 is then compared to the corresponding coordinates determined by the focusing laser. Yet another method may include imparting an image feature onto printing plate 14B with imaging head 116. Carriage 101 may be positioned to a specific sub-scan position to capture a digital camera image of the feature.

Digital camera pixel scaling calibration determines the number of microns per camera pixel. Digital camera pixel scaling calibration may be determined by imaging a feature of known size and assessing how many pixels wide it is. Yet another method of pixel scaling calibration may include imaging a feature onto printing plate 14B at a first known sub-scan position. Carriage 101 may then be moved to a second known sub-scan position to image the feature again. Digital camera 40 may be used to capture a digital camera image of the two imaged features, the distance between the two imaged features being the same as the distance between the first and second known sub-scan positions.

Circumferential or main-scan positional information of a captured digital camera image at a given reference point may be obtained from data provided by encoder 142. In this example embodiment, encoder 142 is a rotary encoder that can be employed to define specific main-scan positions of imaging drum 112 that are typically indexed to an index zero associated with encoder 142. The index zero in turn may correspond to a region of the imaging drum 112 in the vicinity of at least one of the location surfaces 118A, 118B, and 118C.

Encoder 142 can be employed to provide various information pertaining to imaging drum 112 including rotational positioning information and rotational speed information. Rotational drive can be provided to imaging drum 112 by various motion systems known in the art. In this illustrated embodiment of the invention, motor 143 is employed to rotate imaging drum 112 about its axis. Rotational drive can be transmitted by various methods including belt and pulley systems (not shown). Output provided by encoder 142 is provided to drum controller 123. Drum controller 123, via servo amplifier 124, provides drive current to motor 143. Servo amplifier 124 is employed when drum controller 123 comprises circuitry incapable of delivering power of sufficient magnitude to motor 143. Drum controller 122 is shown interfaced to controller 122. Alternatively, drum controller 123 and controller 123 can be merged into a single system controller. It is understood that one or more controllers can be programmed to form one or more tasks within plate-setter 110. Drum controller 123 typically manages a set of parameters in memory defining the physical system to be rotationally driven (i.e. imaging drum 112 and printing plate 14B in this case). These parameters may include parameters such as the inertia of the total drum load, motor torque constants, and encoder resolutions, for example.

Output from encoder 142 can be employed in different ways. In one example embodiment of the invention, encoder 142 provides imaging drum rotational information that is used to coordinate the activation of imaging head 116 as it translates along sub-scan direction while imparting print image 117 onto printing plate 14B. In this example embodiment, output from encoder 142 is managed with "closed loop" techniques during imaging. During imaging, motor 143 is controlled to rotate imaging drum 112 with a substantially constant target rotational speed. Imaging head 112 is controlled by a high frequency clock (i.e. known as Sclk) to control imaging head 116 to form an image pixel onto printing plate 14B. The Sclk and output from encoder 142 need to be synchronized to avoid incorrect placement of the image pixels along the main-scan direction on printing plate 14B. Incorrect main-scan pixel placement can arise from various factors such as variations in the rotational surface speed of imaging drum 112 from the desired target rotational speed.

Typically, the frequency of the output of encoder 142 is too slow to be directly compared to the Sclk and "phase lock loop" (PLL) techniques are employed. For example, the Sclk signal is divided by a number suitable to match the frequency of the output from encoder 142 and the modified signal and encoder signal are compared in a phase comparator (not shown). Any phase differences are adjusted by the imaging head clock to match the frequency of encoder 142 thereby ensuring correct placement of the image pixels on printing plate 14B. While this example embodiment is described with reference to encoder speed control aspects, it is to be understood that encoder positional control aspects are also important in imaging systems.

In various example embodiments of the present invention, it is desired that imaging head 116 and digital camera 40 are moved axially in the sub-scan direction indicated by arrow 24, while imaging drum 112 is kept stationary at a predetermined rotational position. The predetermined rotational position can be selected to allow digital camera 40 to capture digital camera images at sub-scan positions corresponding to the two reference points 28A and 28B. Digital camera 40 may send data corresponding to each of the digital images to an image data processor which identifies a representation of at least a part of reference edge 15B within the images. Typically, the main-scan coordinates of the two reference points 28A and 28B are determined in accordance with data provided by the encoder 142 and the digital camera data representing the parts of reference edge 15B. In this regard, main-scan positional information is required from encoder 142.

Figure 9:
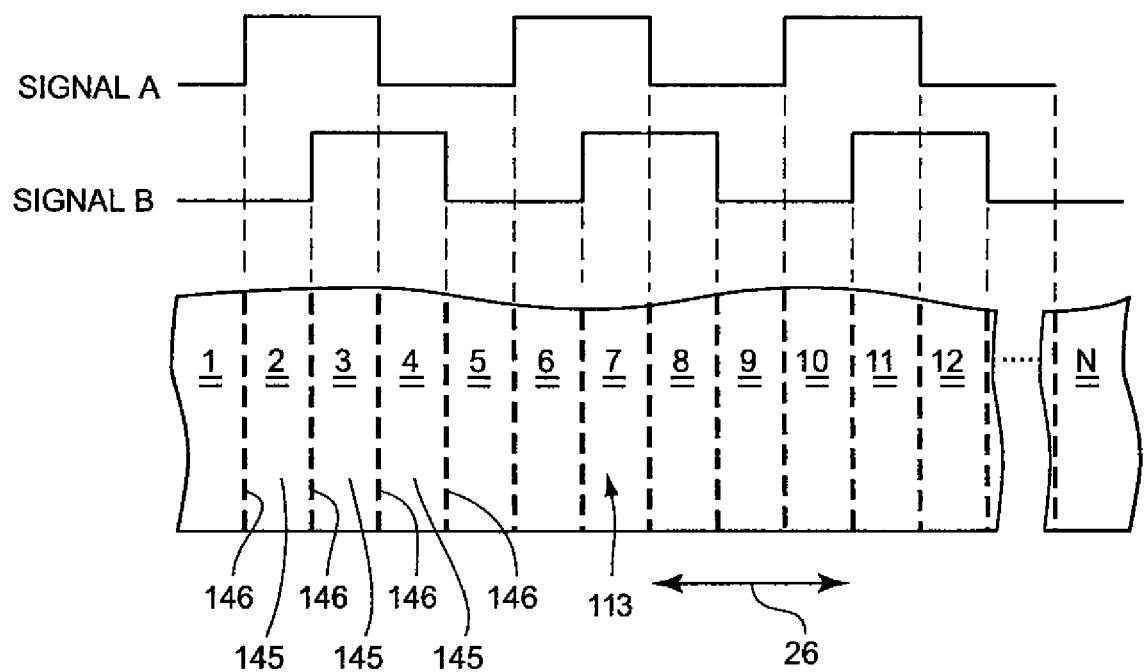
FIG. 9 is a schematic representation of a correlation between two square wave signals outputted by an encoder and various drum zones of an imaging drum used in an example embodiment of the invention.

FIG. 9 schematically shows output from encoder 142 in the form of two square wave signals in quadrature as per an example embodiment of the invention. In this example embodiment, encoder 142 is an incremental rotary encoder. The two output signals are typically referred to as "SIGNAL A" and "SIGNAL B". As shown in FIG. 9, SIGNAL A and SIGNAL B differ in phase from one another by 90 degrees. These signals correspond to a continuous series of imaging drum 112 incremental rotational positions that in turn correspond to a series of incremental circumferential positions around the support surface 113 of imaging drum 112. In this illustrated embodiment, each of the incremental rotational positions correspond to the boundaries 146 between a plurality of drum zones 145 that are continuously mapped along main-scan direction as represented by arrow 26 over support surface 113. In this illustrated embodiment, drum zones 145 are numbered 1, 2, 3, 4, 5, . . . N for clarity.

Main-scan positional determination of each of the drum zones 145 can be established by monitoring SIGNAL A and SIGNAL B. Although SIGNAL A and SIGNAL B are not capable of providing accurate positional information within a given drum zone 145, they are capable of providing accurate positional information of the boundaries 146 between the various drum zones 145. For example as shown in FIG. 9, a non-incremental rotational position corresponding to a region within drum zone 3 is identified when both SIGNAL A and SIGNAL B are high. If either of SIGNAL A or SIGNAL B goes low (i.e. SIGNAL B in FIG. 9), then it is known that imaging drum 112 has moved and has advanced an adjacent drum zone (i.e. drum zone 4). The point in which one of SIGNAL A and SIGNAL B transitions between states corresponds to a boundary 146 between adjacent drum zones 145. In other words, boundaries 146 correspond to incremental rotational positions of imaging drum 112. Regions of imaging drum 112 located between drum zone boundaries 146 correspond to non-incremental rotational positions of imaging drum 112. An index zero associated with encoder 142 typically is used to provide a datum position for the series of incremental rotational positions.

Encoders such as incremental rotary encoders provide excellent accuracy with resolutions suitable for dividing an imaging drum 112 into 10,000 drum zones 145, or more. For example, in one example embodiment, encoder 142 divides an imaging drum 112 having a circumference of 1721 mm into 20,000 drum zones 145 such that each of the drum zones 145 is approximately 86 microns in length along the main-scan direction. For imaging purposes however, even drum zones 145 as small as 86 microns can be too large to provide that main-scan resolution required by the formation of image pixels on printing plate 14B. Accordingly, the Sclk signal divides the output from encoder 142 by suitable number to further incrementally divide the drum zones 145 into sub-zones representative of the main-scan resolution desired of image pixels to be formed. It is to be understood however, that encoder 142 does not have the resolution to determine the position of these various subzones which correspond to various non-incremental rotational positions of imaging drum 112.

Typically, the main-scan coordinates of the two reference points 28A and 28B in the captured images are ideally determined by maintaining imaging drum 112 at a desired stationary rotational position while digital camera 40 captures images of the two reference points 28A and 28B. As previously described, rotational movement of imaging drum 112 is typically controlled with closed loop servo techniques. Using these techniques, imaging drum 112 is typically positioned at a desired incremental rotational position by providing an input signal specifying the desired incremental rotational position. Encoder 142 determines a "current" incremental rotational position and provides feed back to drum controller 123. Drum controller 123 in turn provides the necessary output voltage to motor 143 via servo amplifier 124 to move imaging drum 112 towards the desired incremental rotational position. Drum controller 123 determines a difference between the current incremental rotational position and the desired incremental rotational position to calculate an "error value". This error value in part drives the output voltage to motor 143.

One would assume that once imaging drum 112 reaches the desired incremental rotational position, the error value becomes zero and imaging drum 112 is maintained in a stationary position by motor 143. The present invention, however, has noted that imaging drum 112 does not remain stationary but oscillates about this position. Oscillations can occur for various reasons. For example, slight residual control voltages are often present and can cause imaging drum 112 to drift. Imbalances associated with imaging drum 112, or with the combination of imaging drum 112 and printing plate 14B, can cause imaging drum 112 to drift. Once drum controller 123 determines that drift has occurred after imaging drum 112 has been positioned at the desired incremental rotational position, it applies a small change to the output voltage to compensate for the drift. Unfortunately, even after imaging drum 112 is restored to its desired incremental rotational position, the factors responsible for the drift are still present and the oscillatory movement continues as drum controller 123 continues to compensate for the drift.

The oscillation of imaging drum 112 during the capturing of images by digital camera 40 leads to the introduction of errors in the subsequent determination of the main-scan positions of each of the two reference points 28A and 28B. For example, in the previously described example in which an imaging drum 112 having a circumference of 1721 mm is employed, oscillations of around 86 microns can occur as imaging drum 112 alternates between drum zone boundaries 146. Oscillations of this magnitude can lead to significant errors in the determination of the main-scan positions of each of the two reference positions 28A and 28B.

Figure 10:
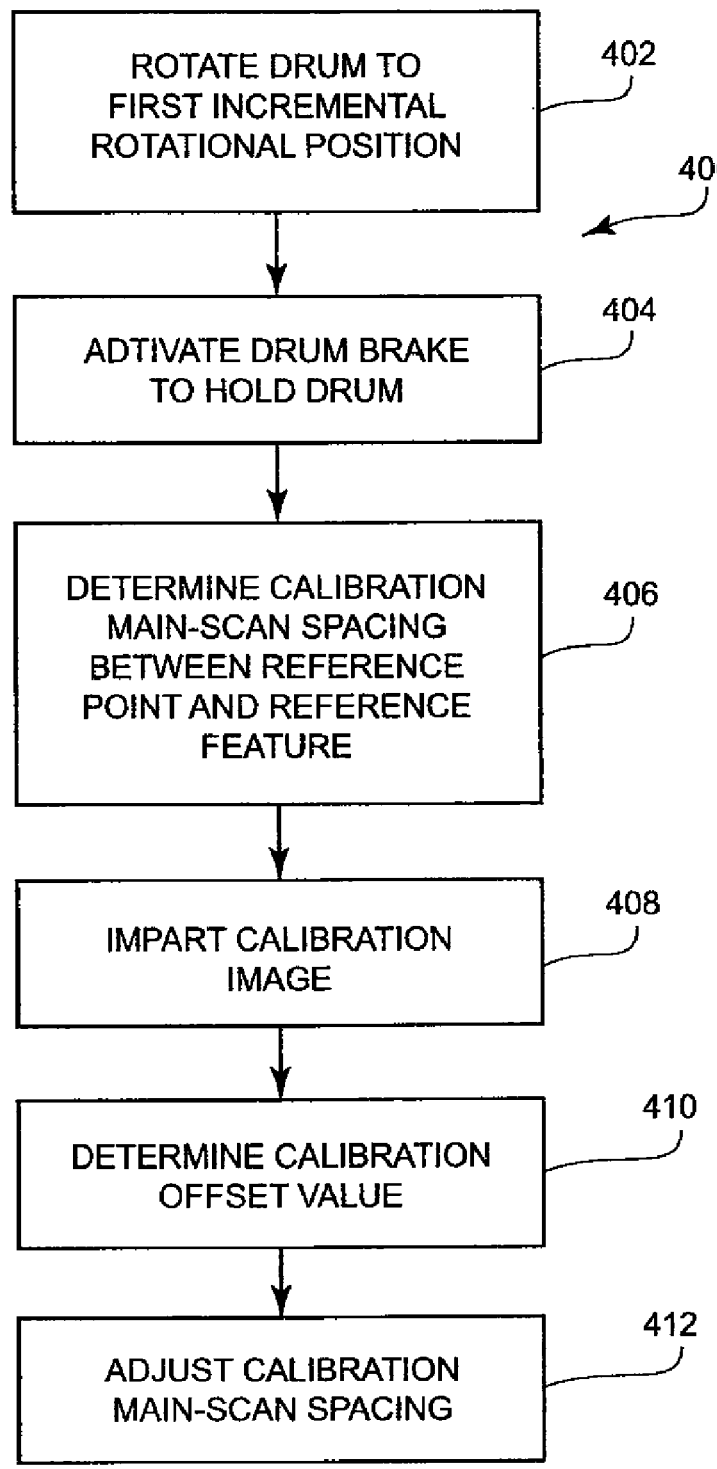
FIG. 10 is a flow chart representative of a method for accurately determining required imaging registration parameters by overcoming undesired imaging drum oscillations.

FIG. 10 shows a flow chart representative of a method for accurately determining required imaging registration parameters in spite of the oscillatory movement that accompanies the use of encoder 142 to maintain imaging drum 112 in a stationary position. FIG. 10 shows a flow chart representative of a calibration process for the determination of the main-scan positions of the two reference points 28A and 28B.

The calibration process 400 includes block 402 where printing plate 14B is mounted onto imaging drum 112 which is rotated under the guidance of encoder 142 to a first incremental rotational position in which registration edge 15B is in the field of view of digital camera 40. Motor 143 is operated to maintain imaging drum 112 at the first incremental rotational position under the guidance encoder 142. Since the motion system is controlled to maintain imaging drum 112 stationary at the first incremental rotational position, imaging drum 112 will oscillate along a path away from, and towards to, the first incremental rotational position as previously described.

As shown in one example embodiment of the invention illustrated in FIG. 5, plate-setter 110 includes drum brake 135. In block 404, drum brake 135 is operated to hold imaging drum 112 stationary after imaging drum 112 is positioned at the first incremental rotational position. In some example embodiments of the invention, drum brake 135 is a light duty brake that is configured to merely hold imaging drum 112 in a steady position. In various embodiments of the invention, the held rotational position of imaging drum 112 will not be exactly known. That is, the application of drum brake 135 will occur as imaging drum 112 oscillates towards and away from the first incremental rotational position. Accordingly in some example embodiments, drum brake 135 will hold imaging drum 112 while imaging drum 112 is positioned at an incremental rotational position while in other embodiments of the invention, drum brake 135 will hold imaging drum 112 while it is positioned at a non-incremental rotational position located between to adjacent incremental rotational positions. The position in which imaging drum 112 is held will depend the timing of the activation of drum brake 135 in relation to oscillatory movement of imaging drum 112. Since much of the oscillatory movement positions imaging drum 112 away from an incremental rotational position, the activation of drum brake 135 is likely to hold imaging drum 112 stationary at a non-incremental rotational position. It is important to understand that when imaging drum 112 is held at a non-incremental rotational position, encoder 142 is incapable of ascertaining the exact rotational position of imaging drum 112 (i.e. imaging drum 112 is held somewhere between two adjacent incremental rotational incremental positions).

In some example embodiments of the invention, drum brake 135 is adapted to maintain imaging drum 112 in a steady position to better than 10 micro-radians. The braked positional accuracy of drum brake 135 can depend on the size of imaging drum 112 with larger diameter imaging drums requiring high positional steadiness values. In some example embodiments of the invention, a relatively light duty drum brake 135 incapable of resisting torque levels that are greater than those applied by motor 143 to correct for drum drift. In some example embodiments, motor 143 is operated to cease applying torque to imaging drum 112 after drum brake 135 is activated to brake imaging drum 112. In these embodiments, drum brake 135 can be configured with reduced braking abilities, albeit with a possibility of increased wear of the brake components. Light duty brakes are preferred for their relatively low cost. In some example embodiments, heavier duty drum brakes 135 are employed. In addition to holding imaging drum 112 at a non-incremental or incremental rotational position, such brakes can be used to reduce the time required to decelerate imaging drum 112 from high rotational speeds (e.g. rotational speeds employed during imaging) to lower rotational speeds. In some example embodiments of the invention, drum brake 135 can include a member (not shown) comprising a suitably stiff friction material such as a high durometer rubber. One or more flexures (also not shown) can act as a high stiffness, minimal play joint about which the member is pivoted into, and out of engagement with a surface of imaging drum 112.

As shown in one example embodiment of the invention illustrated in FIG. 3, plate-setter 110 includes one or more reference features 137 (i.e. one in this example) fixedly positioned on a surface of imaging drum 112. In this illustrated embodiment, reference feature 137 is positioned in drum slot 140. Reference feature 137 can include various shapes and forms suitable for detection by digital camera 40. Without limitation, a reference feature 137 can include various registration marks or fiducials. A reference feature 137 can include cross-hairs, diamond shapes, circular shapes and the like.

In block 406, a calibration main-scan spacing is determined between one of reference points 28A and 28B on reference edge 15B and reference feature 137. In this example embodiment, this is accomplished by moving carriage 101 to appropriately positioned digital camera 40 to capture images of reference feature 137 and one of reference points 28A and 28B. In various example embodiments, illumination source 105 can be additionally employed to assist in the capture of various ones of the digital images. Controller 122 may be employed to determine the calibration main-scan spacing between one of reference points 28A and 28B and reference feature 137 from data provided by the captured digital camera images. The calibration main-scan spacing is typically expressed in microns or in integer multiples of a main-scan resolution of the image pixels that can be formed on printing plate 14B. The calibration main-scan spacing need not be an integer multiple of a main-scan size of the drum zones 145. The calibration main-scan spacing need not be an integer factor of a main-scan size of the drum zones 145.

In block 408, plate-setter 110 is operated to impart print mage image 117 onto printing plate 14B. In this case, print image 117 is a calibration image. Various imaging parameters are controlled within controller 122 to cause imaging head 116 to position print image 117 from reference edge 15B by a target offset value which is typically referenced from an index zero associated with encoder 142. It is to be noted that the target offset value is typically expressed in microns or in integer multiples of a main-scan resolution of the image pixels. The target offset value need not be an integer multiple or an integer factor of a main-scan size of the drum zones 145.

In block 410, a calibration offset value is determined. The distance between print image 117 and one or more of the reference points 28A and 28B is physically measured to determine any deviation between the actual positioning of print image 117 and the desired positioning of print image 117 as required by the target offset value. Physical measurements may be made in various ways as known in the art. For example, such measurements may be made by removing printing plate 14B from imaging drum 112 and measuring printing plate 14B in a precision optical measurement table typically employed to determine image aberrations or image geometric distortions. The target offset value is corrected to account for the physically measured deviations to produce the calibration offset value. The calibration offset value is typically expressed in units of microns or in integer multiples of a main-scan resolution of the image pixels.

It is to be understood that when subsequent printing plates are mounted onto imaging drum 112 for imaging, they will have orientations with respect to imaging drum 112 that vary from the orientation of printing plate 14B which was employed for calibration purpose. Accordingly, prior to the imaging of a subsequent printing plate, digital camera 40 is employed to capture images of reference feature 137 and at least one of reference points 28A and 28B on the reference edge of the subsequent printing plate. For example, digital camera 40 can capture a digital image of a first region comprising at least a part of reference edge 15B associated with the at least one point on the edge and capture a digital image of a second region comprising reference feature 137. In some example embodiments of the invention separate digital images are captured. In other example embodiments of the invention a plurality of digital cameras 40 are employed.

The digital images are then analyzed by controller 122 and the position of the detected point relative to the detected reference feature 137 is determined as described below or by other suitable methods. In some embodiments, determining the position of the detected point relative to the reference feature includes comparing the location of the part of the edge in the digital image of the first region with the location of the reference feature 137 in the digital image of the second region. In this example embodiment, a main-scan spacing between reference feature 137 and at least one of reference points 28A and 28B is determined.

The determined main-spacing is then compared against the previously determined calibration main-scan spacing. Any deviation between the determined main-scan spacing and the previously determined calibration main-scan spacing is indicative of a different positioning of the reference edge of the subsequently mounted printing plate. Accordingly in block 412, the calibration offset value is adjusted to account for these deviations during the imaging of these subsequently mounted printing plates.

Advantageously, by determining the position of each of the reference points 28A and 28B relative to reference feature 137 in the digital camera images, positional variances associated with holding imaging drum 112 at a non-incremental rotational position are avoided. Imaging drum 112 is further prevented from moving while positioned at a non-incremental rotational position to further eliminate unwanted positional variances in the captured images of the at least two reference points 28A and 28B.

Various methods can be employed to determine the position of various portions of reference edge 15B in the captured digital images. The Haar transform is an established mathematical technique in image processing. In one example embodiment of the present invention, the Haar transform is used to "pattern match" a prototype edge with the sequence of values derived from integrating the digital camera image pixels. The Haar transform is applied to a (narrower) sequence of integrated prototype edge values to produce a first vector. The Haar transform is also applied to a portion of a sequence of the digital camera image integrated values to produce a second vector. The dot product of these two vectors is referred to as correlation. Correlation is a measure of the pattern match between the prototype edge and an edge found at that location in the digital camera image. This process can be repeated for alternate portions of the sequence of the digital camera image integrated values, to produce a correlation graph. Each of the alternate portions typically starts at each consecutive pixel location of the digital camera image.

The location of maximum correlation (i.e. the global maximum) has a high probability of corresponding to the reference edge portion in the image.

The global maximum of the correlation graph may in some cases, lead to an erroneous result. There may be other local maxima in the graph, one of which may correspond to the reference edge 15B. A local maximum may be located by applying a similar wavelet transform to the correlation graph. A coiflet transform operation may be applied to the entire correlation graph, producing a coiflet transform vector. A threshold may be selected wherein values below the threshold are reduced to zero. The transform operation may then be reversed and a modified version of the correlation graph reproduced. This technique can be employed in image compression. In the present invention, the compression applied may be of a magnitude that the modified version of the correlation graph is a sequential series of width and height scaled coiflet mother wavelets. Each of the local maxima present in the original correlation graph will typically become the center (peak) of one of the mother wavelets. Finding the locations of the local maxima is simply a matter of listing the locations of the mother wavelets. In this way, an image may have several possible choices of locations for the imaged portion of the reference edge 15B, some more likely to be correct than others.

Processing improvements may be made by setting Haar transform vector values to zero if they are under a predetermined threshold before taking the dot product. The present invention may further use any suitable image processing method and associated edge detection algorithm to distinguish the portion of reference edge 15B captured in the video frames. The position of the two reference points 28A and 28B may be determined by the identification of these locations and from main-scan and sub-scan positional information during the capturing of the images at reference points 28A and 28B. The determined locations of the two reference points reference 28A and 28B may then be used to determine a transform to apply to print image data such that when the transformed print image data is communicated to imaging head 116 and its associated radiation source, print image 117 is substantially aligned with reference edge 15B.

It is to be understood that the present invention is not limited to the use of the Haar transform and suitable correlation or convolution algorithm may be used to distinguish between the prototype edge and digital images. The present invention can employ an algorithm to locate various portions of reference edge 15B in associated digital images that is different than an algorithm that is employed to locate reference feature 137 in an associated digital image. For example, the use of different algorithms may be appropriate when reference feature 137 comprises a spatial form (e.g. a circular form) that differs significantly from the form of reference edge 15B.

One or both of printing plate 14B and imaging drum 112 may have surface imperfections that may appear to produce images that may obscure the contrast of the reference edge 15B at the detected positions. The surface imperfections themselves may have a form and shape that may lead to erroneous results if the edge detection algorithms employed mistakenly interpret the imperfections as part of reference edge 15B. Erroneous results may also occur if the edge detection algorithms interpret regular imaging drum 112 features as part of reference edge 15B. A plurality of locations oriented along the sub-scan direction may be imaged by digital camera 40 and defined by a suitably chosen edge detect algorithm. The plurality of locations may be greater in number than the at least two reference points 28A and 28B. If each location produces at least one edge value, a best-fit straight line may then be fitted through these points. The best-fit straight line forms a relationship between the determined sub-scan or axial locations of the plurality of points and their corresponding circumferential locations to assess the accuracy of the determined locations with respect to the straight line that theoretically represents a straight plate edge.

Each digital camera image from the plurality of locations along the sub-scan direction may instead result in a plurality of possible reference edge positions in at least one of the locations, each associated with a figure of merit. An algorithm for fitting a straight line can be designed to select from the possible reference edge locations, with a higher weighting for edge locations with a high figure of merit. If one or a few of the high figure of merit reference edge locations do not lie in a straight line and a lower figure of merit edge location does lie nearer the straight line, it may be selected instead. Standard methods for best straight-line fitting may be applied to the selected set of reference edge locations. The locations of reference points 28A and 28B will typically lie on, or very close to the fitted straight line. Once the locations of the two reference points 28A and 28B are confirmed and/or adjusted, the transformation for print image data may be determined.

Certain implementations of the invention comprise computer processors that execute software instructions that cause the processors to perform a method of the invention. For example, one or more data processors in controller 122 may implement method 300 of FIG. 3 and/or method 400 of FIG. 10 by executing software instructions in a program memory accessible to the processors. The invention may also be provided in the form of a program product. The program product may comprise any medium which carries a set of computer-readable signals comprising instructions which, when executed by a computer processor, cause the data processor to execute a method of the invention. Program products according to the invention may be in any of a wide variety of forms. The program product may comprise, for example, physical media such as magnetic data storage media including floppy diskettes, hard disk drives, optical data storage media including CD ROMs, DVDs, electronic data storage media including ROMs, flash RAM, or the like or transmission-type media such as digital or analog communication links.

Figure 6:
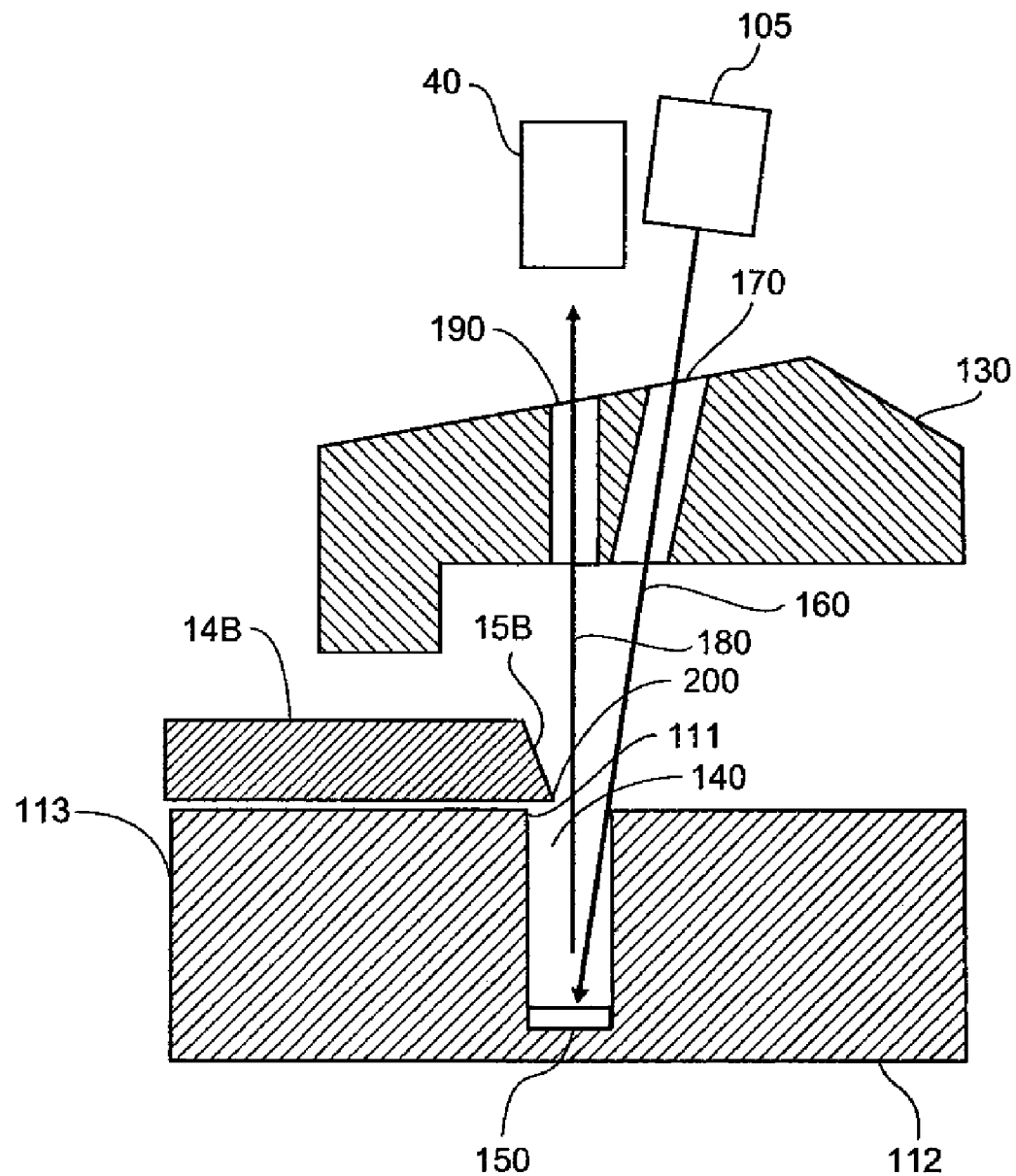
FIG. 6 is a schematic illustration of a digital camera based arrangement for imaging the edge of a printing plate by a method of the present invention.

The backlit edge method and apparatus of example embodiments of the invention are described in FIGS. 5-8 and 11-16. FIG. 6 is a cross-section of drum 112 and of clamp 130 located at second reference point 28B of FIG. 5. In FIG. 6 printing plate 14B is held to support surface 113 of imaging drum 112 by clamp 130 such that mechanical edge 200 of reference edge 15B of printing plate 14B protrudes over drum slot edge 111 of drum slot 140 positioned on imaging drum 112. As is shown in FIG. 5, carriage 101 may be moved such that digital camera 40 is in a position to image reference edge 15B of printing plate 14B at second reference point 28B through clamp 130 and that illumination source 105 may simultaneously illuminate reference edge 15B at second reference point 28B through clamp 130. This arrangement is shown in detail in FIG. 6, in which illumination source 105 illuminates reflective layer 150 that has a reflective surface, located in the bottom of drum slot 140 on a radially recessed surface, through illumination baffle 170 of clamp 130 with illuminating light beam 160. Reflected light 180 is gathered by digital camera 40 through imaging aperture 190 in clamp 130 and is used by digital camera 40 to capture an image of second reference point 28B. The illuminating is therefore performed on the side of printing plate 14B that is in contact with the imaging drum 112. In FIG. 6 reference edge 15B is specifically shown with a bevel angle produced by the cutting of the un-imaged printing plate 14B.

If printing plate 14B and reference edge 15B were to be illuminated from the top, instead of as in this example embodiment of the invention, the light reflected from the top surface of printing plate 14B and the light reflected from the bevel edge of reference edge 15B would make it very difficult to determine the actual mechanical edge 200 of reference edge 15B of printing plate 14B. By illuminating the surface of printing plate 14B that faces away from digital camera 40 using the light reflected by reflective layer 150, the contrast between the true mechanical edge 200 of reference edge 15B and reflective layer 150 is much improved because the reflection of light from any surfaces of printing plate 14B has been limited. This allows more accurate determination of the true mechanical edge of reference edge 15B of printing plate 14B by the image analysis methods described herein.

Some of the light from illumination source 105 can be reflected from reflective layer 150, illuminate the bevel surface of reference edge 15B, and find its way into digital camera 40, thereby obscuring the true location of the mechanical edge of reference edge 15B. In the present specification the term "plate edge obscuring light" is used to describe such light. In an embodiment of the present invention, shown in FIG. 11, in which the depth of drum slot 140 is exaggerated for the sake of clarity, plate edge obscuring light is reduced by employing a plurality of individual light sources within illumination source 105. Advantageously, considering size and cost, these can be light emitting diodes (LEDs), but any other suitably small light sources can be employed, such as, but not limited to, optical fiber light sources or a liquid crystal display (LCD) panel comprising a large plurality of selectively addressable cells and suitable flood backlighting. Larger individual light sources can also be used and simply positioned further away from drum slot edge 114. The number of individual light sources is shown, for the sake of clarity, as being only three, namely 105A, 105B, and 105C producing illuminating light beams 160A, 160B, and 160C respectively. This allows at least one of the individual light sources to be selected and used as illumination source at a time. As can be seen from FIG. 11, this allows small, but significant adjustments to be made to the circumferential position of the shadow of drum slot edge 114 cast on reflective layer 150. This, in turn, directly limits the amount of edge obscuring light.

Figure 12:
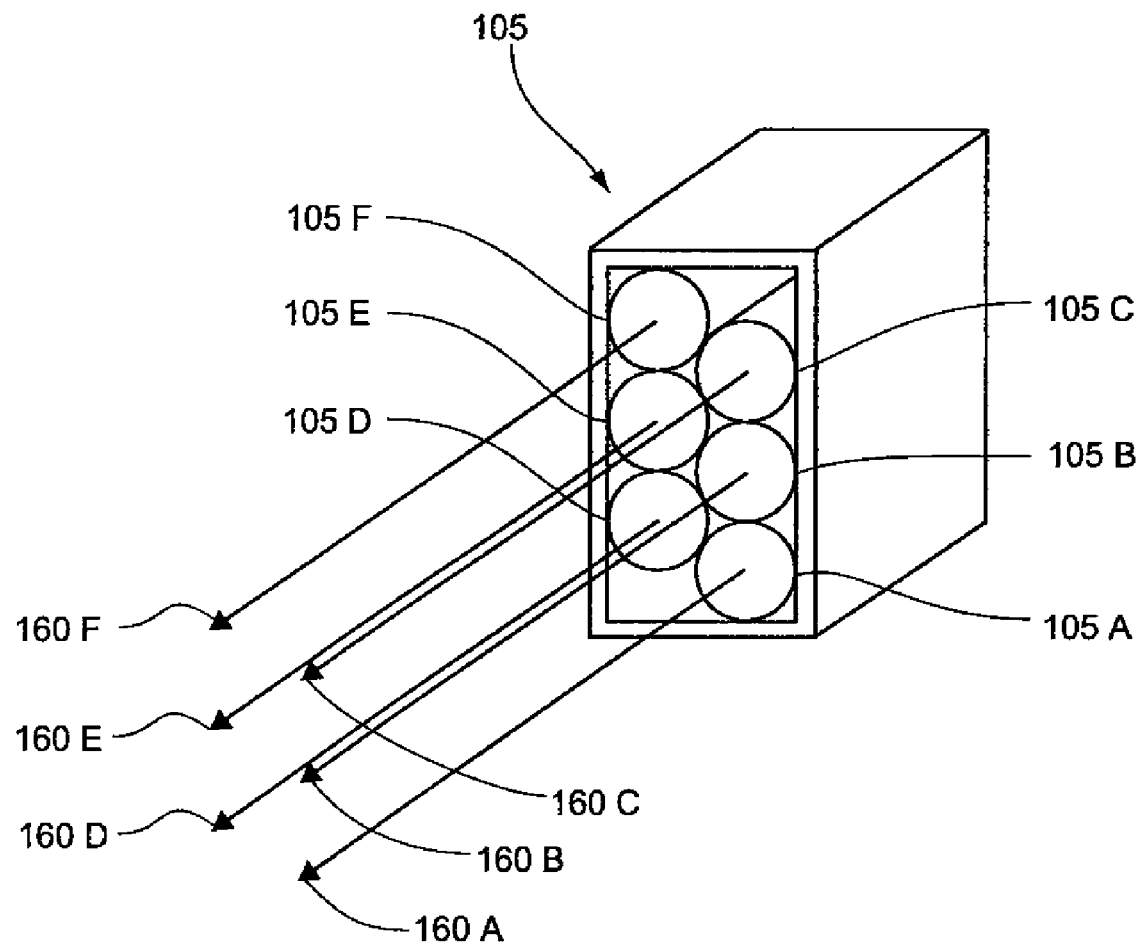
FIG. 12 is a schematic illustration of an illumination source comprising a plurality of individual light sources as per an embodiment of the present invention.

In practice any number of LEDs can be used and they can be staggered, as shown in an embodiment of the present invention in FIG. 12, which shows only illumination source 105. This creates fine control of circumferential position of the shadow of drum slot edge 114 cast on reflective layer 150 by selecting one of individual light sources 105A, 105B, 105C, 105D, 105E, and 105F. Illuminating light beams 160A, 160B, 160C, 160D, 160E, and 160F respectively are the beams that define the edge of the shadow of drum slot edge 114 on reflective layer 150.

Figure 7:
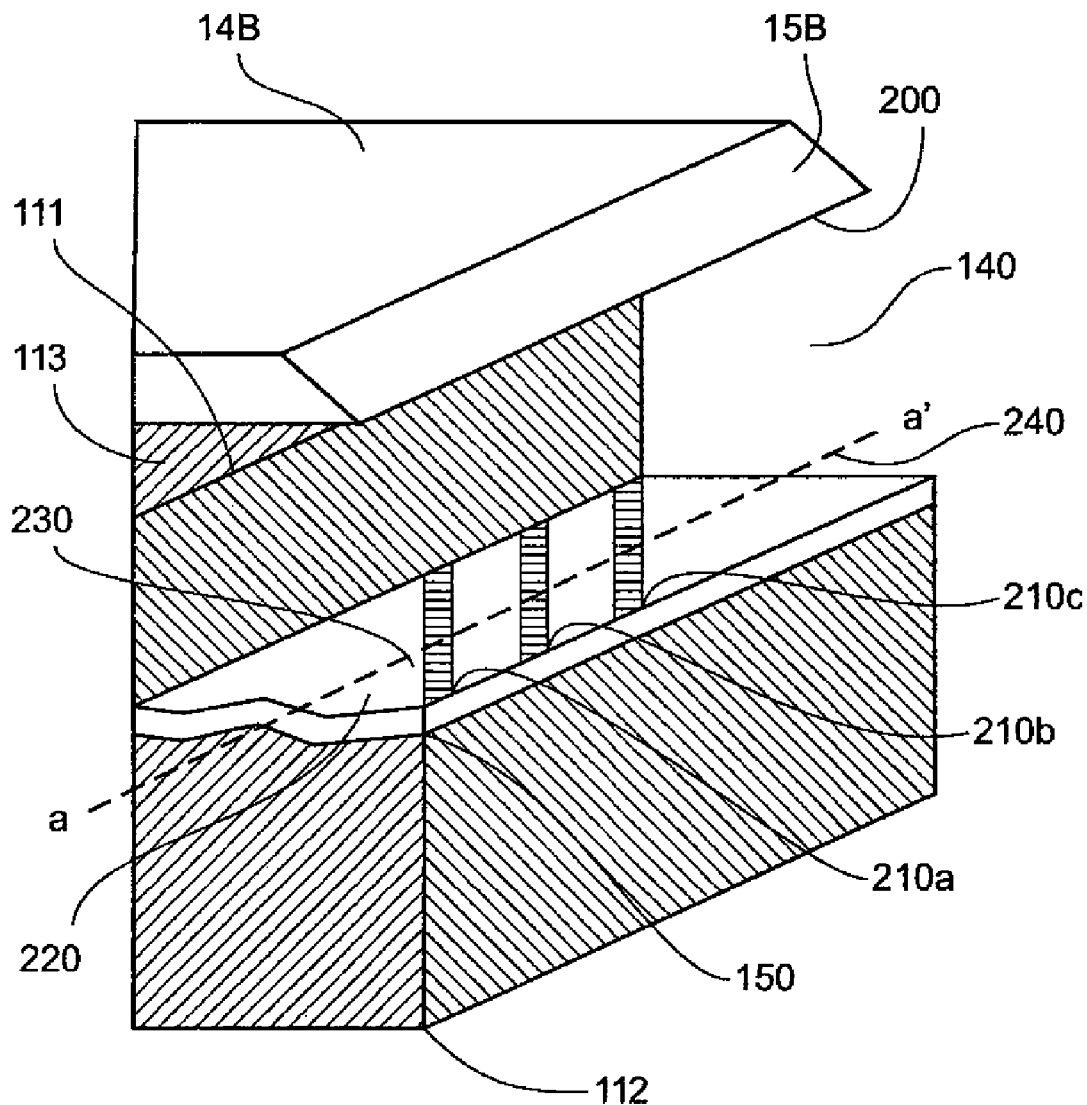
FIG. 7 is a cutaway drawing of the drum of a plate-making machine, showing the slot in the drum and the placement of reflecting and non-reflecting members.
Figure 11:
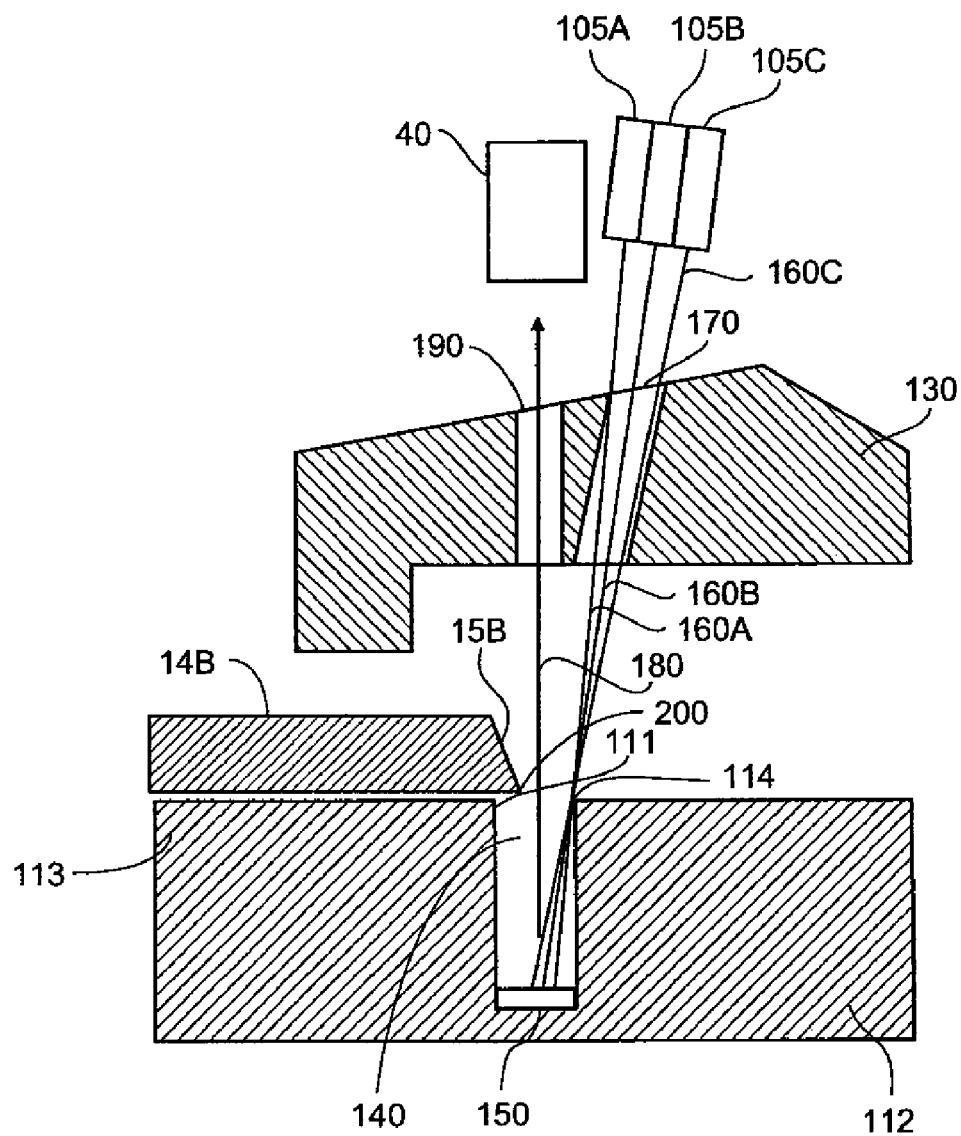
FIG. 11 is a schematic illustration of a digital camera based arrangement for imaging the edge of a printing plate by a method of the present invention employing a plurality of individual light sources.
Figure 13:
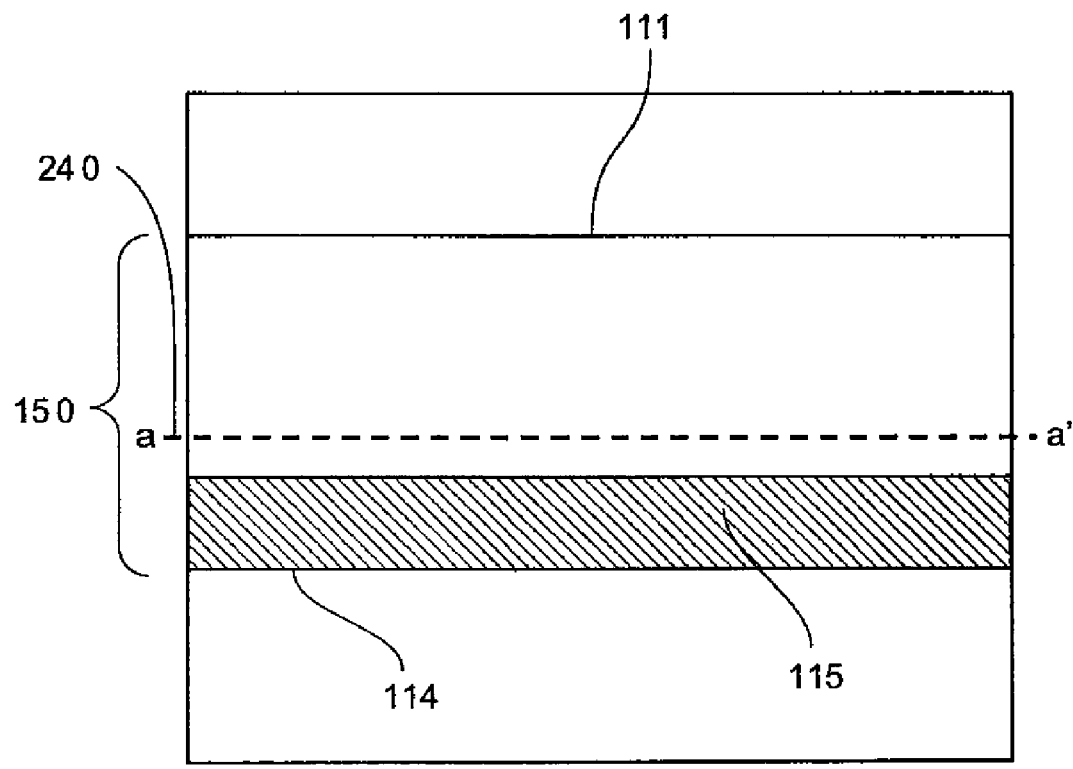
FIG. 13 is a schematic illustration of a region of a drum slot with a straight edge illuminated by a plurality of individual light sources.

In use, the method by which the embodiments of the invention in FIG. 11 and FIG. 12 are employed, comprises selecting among the plurality of individual light sources that individual light source that casts the largest drum slot edge shadow 115 (see FIG. 13, which shows a plan view of a region of drum slot 140) on reflective layer 150, while illuminating the region of reflective layer 150 in the vicinity of perpendicular projection 240. As shown in FIG. 7 and FIG. 13, the line denoted by a-a', is the perpendicular projection 240 onto reflective layer 150 of mechanical edge 200. In practice this comprises optionally turning on additional individual light sources that illuminate the vicinity of perpendicular projection 240 on reflective layer 150 without illuminating the area of shadow 115. This approach allows enough illuminating light to impinge on reflective layer 150 in the vicinity of perpendicular projection 240 to allow digital camera 40 to obtain a clear silhouette image of image reference edge 15B. Individual light sources that do illuminate the area of shadow 115 of drum slot edge 114 cast on reflective layer 150 can contribute to plate edge obscuring light and, in the method of the present invention, are turned off. The amount of plate edge obscuring light is therefore adjusted by selectively turning on one ore more of the individual light sources to adjustably cast a shadow of drum slot edge 114 on reflective layer 150.

Returning to FIG. 11, the matter of which subset of individual light sources is preferred for the purpose, depends on the exact circumferential position of reference edge 15B with respect to drum slot 140 on imaging drum 112 of FIG. 5. If reference edge 15B projects far over drum slot 140, then it is likely that individual light source 105A would need to be used to ensure that the shadow of drum slot edge 114 cast on reflective layer 150 is not located underneath reference edge 15B. One or both of individual light sources 105B and 105A can also be turned on to provide more light on reflective layer 150 by which to obtain a clear silhouette of reference edge 15B. This is largely determined by the sensitivity of digital camera 40. In this case, the subset of individual light sources can be 105A alone, 105A and 105B, or all three of 105A, 105B, and 105C.

Conversely, if reference edge 15B projects very little over drum slot 140, then it is likely that individual light source 105C would need to be used. Since there are no further individual light sources to the right of individual light source 105C in the embodiment shown in FIG. 11, only individual light source 105C would be turned on in this case, as turning on either of individual light source 105B or individual light source 105A would merely provide light within the shadow of drum slot edge 114 cast on reflective layer 150 by illuminating light beam 160C from individual light source 105C. This contributes little if anything to the silhouette of reference edge 15B and is likely to merely contribute to plate edge obscuring light.

If reference edge 15B projects over drum slot 140 to an extent between these extremes, individual light source 105B would likely need to be used. The matter of whether additional individual light source 105C would need to be turned on depends on the intensity of selected individual light source 105B. As above, it is a balance between the need for a clear silhouette, and a need to reduce sources of potential edge obscuring light.

In the case of the arrangement shown in FIG. 12, there are more choices of individual light sources possible, and larger numbers of additional individual light sources can be turned on to add to the silhouette of reference edge 15B. This makes the possible adjustments more sensitive than in the arrangement shown in FIG. 11. Clearly, the more individual light sources there are within illumination source 105, the greater the precision with which the shadow of drum slot edge 114 cast on reflective layer 150 can be positioned for suitable effect. Simultaneously it also provides greater choice of additional illumination to improve the silhouette of reference edge 15B as imaged by digital camera 40.

Figure 14:
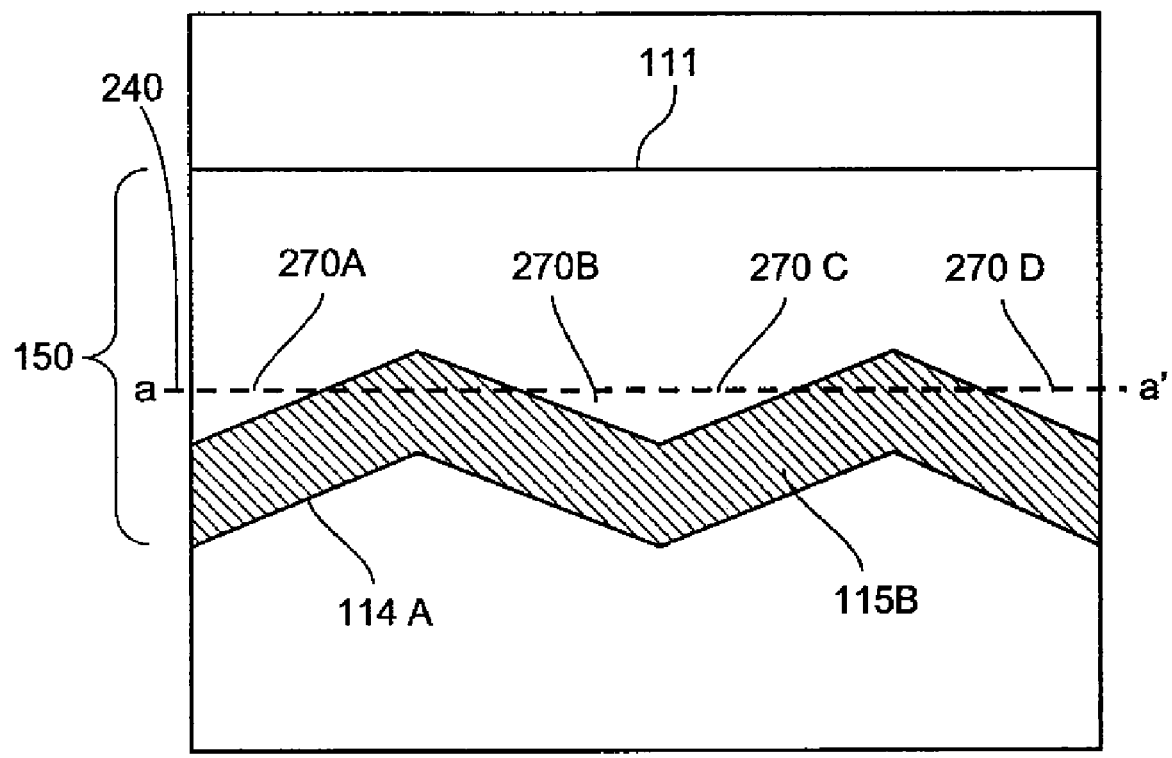
FIG. 14 is a schematic illustration of a region of a drum slot with a notched edge illuminated by a plurality of individual light sources.
Figure 15:
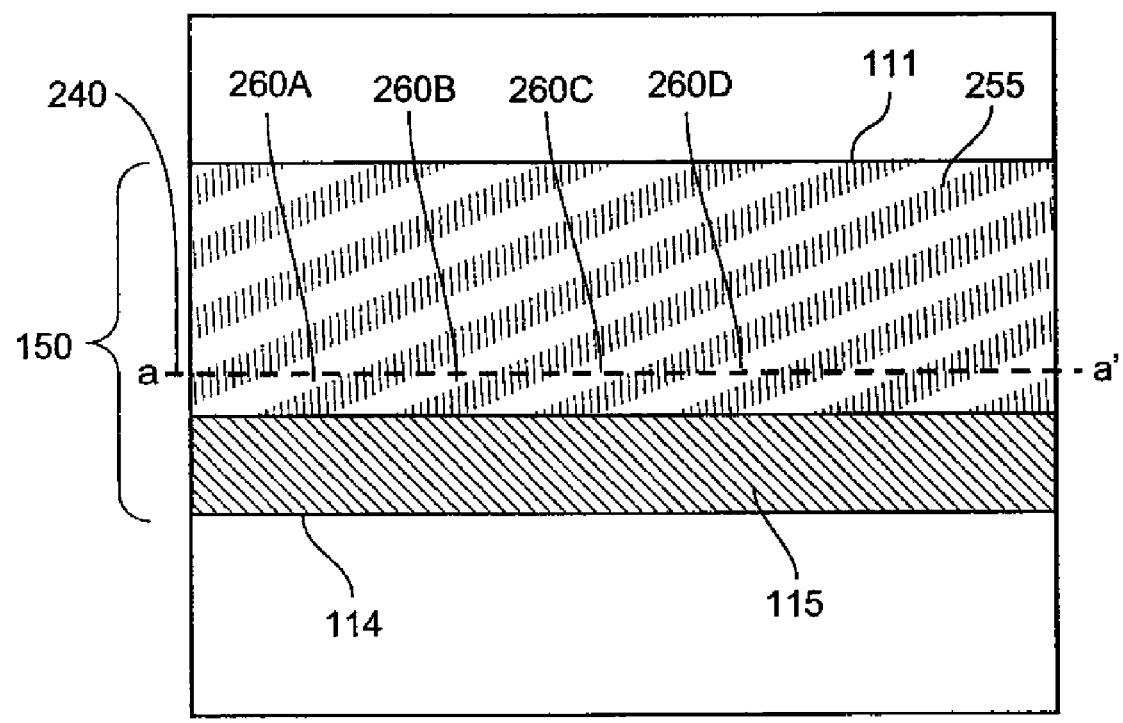
FIG. 15 is a schematic illustration of a region of a drum slot with a straight edge illuminated by a plurality of individual light sources in which the drum slot comprises a reflective layer having a plurality of non-reflective areas.

In an embodiment of the present invention, shown in FIGS. 5, 7, 11, 12, and 14, drum slot edge 114A is notched in a manner than creates a varying width for drum slot 140. In the example embodiment of FIG. 14, drum slot edge 114A is skewed to be non-parallel with drum slot edge 111 and mechanical edge 200. FIG. 14 shows one embodiment of a notched drum slot edge that is easy to machine. Any shape that repeats axially along imaging drum 112 (see FIG. 5) may be imparted to drum slot edge 114, but those that cause drum slot edge 114A to approach perpendicular projection 240 at a usefully acute angle are preferred. At least part of drum slot edge 114 is therefore non-parallel with the drum slot edge 111. To understand the working of this embodiment, refer to FIG. 11, in which, for the sake of clarity, consider one illuminating light beam 160B from one light source 105B. Illuminating light beam 160B casts drum slot edge shadow 115B (shown in FIG. 14) on reflective layer 150 in the bottom of drum slot 140 (see FIG. 11). Drum slot edge shadow 115B can protrude in under mechanical edge 200 of printing plate 14B, implying that perpendicular projection 240 crosses drum slot edge shadow 115B, as shown in FIG. 14. A plurality of acute reflective apexes 270A, 270B, 270C, and 270D are therefore created in the illuminated areas between perpendicular projection 240 and drum slot edge shadow 115. The exact circumferential position of drum slot edge shadow 115B is adjustable via the choice of individual light source among 105A, 105B, 105C, 105D, 105E, and 105F as already explained above in FIG. 11 and FIG. 12. Again, as already explained various other individual light sources may be turned on or off to adjust the amount of plate edge obscuring light in order to obtain a suitable balance between the silhouette of reference edge 15B of printing plate 14B on the one hand and to lower the amount of plate edge obscuring light on the other.

In an embodiment of the present invention, the contrast may be further enhanced, and the true mechanical edge 200 of reference edge 15B of printing plate 14B more precisely determined, by employing the arrangement of FIG. 7. FIG. 7 shows a cutaway of drum slot 140 in imaging drum 112 of FIG. 5. Printing plate 14B having beveled reference edge 15B with mechanical edge 200 is clamped to the cylindrical support surface 113 of imaging drum 112 by a clamp (not shown for clarity) such that mechanical edge 200 of reference edge 15B of printing plate 14B protrudes over drum slot edge 111 of drum slot 140 in imaging drum 112. Mechanical edge 200 has perpendicular projection 240 on reflective layer 150 given by line a-a'. In this embodiment of the present invention reflective layer 150 has upon its surface facing digital camera 40 a plurality of non-reflective areas 210a, 210b, and 210c. Any shape may be chosen for the non-reflective areas 210a, 210b, 210c, though shapes having perimeters that form at least one acute angle with perpendicular projection 240 of mechanical edge 200 are preferred. In FIG. 7 non-reflective areas 210a, 210b, 210c, in the form of diagonally slanted strips, have been chosen as being one simple choice that satisfies this preference. In a more general case at least part of the perimeters of non-reflective areas 210a, 210b, 210c are non-parallel with drum slot edge 111. Acute reflective apex 230 is formed in the reflective part of reflective layer 150 between perpendicular projection 240 and non-reflective area 210a. Similar acute reflective apexes are formed between perpendicular projection 240 and non-reflective areas 210c and 210b and are not indicated in FIG. 7 for the sake of clarity. The image of second reference point 28B obtained by digital camera 40 comprises at least one non-reflective area 210a, at least one acute reflective apex 230 and mechanical edge 200 of reference edge 15B. The image of reference edge 15B so obtained comprises mechanical edge 200, if a bevel is present on the particular printing plate 14B. The illuminating of reference edge 15B is thus spatially interrupted along an interrupting section of that part of the reference edge 15B that is associated with second reference point 28B.

Given that light reflected from reflective layer 150 may potentially illuminate the beveled surface of printing plate 14B along reference edge 15B, non-reflective areas 210a, 210b, 210c, provide for regions of mechanical edge 200 of reference edge 15B, corresponding to non-reflective areas 210a, 210b, 210c, substantially not being illuminated at all. On the other hand, regions of mechanical edge 200 of reference edge 15B, corresponding to reflecting region 220 of reflective layer 150 may conversely be illuminated, depending on the angle of the bevel of reference edge 15B. By imaging reference edge 15B in the vicinity of acute reflective apex 230 mechanical edge 200 of reference edge 15B may be determined very accurately in the illuminated area adjacent to acute reflective apex 230. In regions of mechanical edge 200 of reference edge 15B, protruding over non-reflective areas 210a, 210b, 210c, mechanical edge 200 cannot be identified for lack of illumination, while, in regions of mechanical edge 200 of reference edge 15B protruding over reflecting region 220 of reflective layer 150, illumination of the beveled surface of reference edge 15B by stray reflected light from reflecting region 220 may still potentially induce small errors in the locating of mechanical edge 200 in the image. Optimally accurate determination of the location of mechanical edge 200 therefore occurs in those regions of reference edge 15B protruding over acute reflective apex 230 of the reflective part of reflective layer 150. Again, the determination of mechanical edge 200 from the image obtained by digital camera 40 at second reference point 28B occurs by the analysis process already described. It is to be noted that, in the case of a printing plate 14B having reference edge 15B with a bevel of the opposite sense to that shown in FIGS. 6 and 7, mechanical edge 200 is the outer edge imaged by default by digital camera 40 and no light directly reflected by that beveled surface can reach digital camera 40 to create an image that might mislead the user as to the exact location of mechanical edge 200.

Since reference edge 15B may need to be determined at two reference points 28A and 28B along imaging drum 112 in order to determine the required image rotation, the arrangement described here may be repeated at a plurality of points along the clamping system of imaging drum 112. Typical drum systems have continuous or segmented clamp arrangements, spanning substantially the entire axial width of imaging drum 112. In a further implementation of the present invention a single clamp 120 or 130 can therefore have a plurality of mutually fixed arrangements of illumination baffles 170 and imaging apertures 190, the result being that, in any chosen region along the axial length of reference edge 15B there is always a nearby set of illumination baffle 170 and imaging aperture 190 that can be used to implement the edge detection method of this example embodiment of the invention.

In an embodiment of the present invention, a series of non-reflective areas 210a, 210b, 210c are fashioned on reflective layer 150 in the vicinity of a chosen second reference point 28B such that the image captured by digital camera 40 comprises a plurality of images of non-reflective areas 210a, 210b, 210c. Since non-reflective areas 210a, 210b, 210c have perimeters that are non-parallel with drum slot edge 111 and mechanical edge 200, this provides a plurality of acute reflective apexes 230 at which mechanical edge 200 can be determined, thereby improving the accuracy of the analysis yet further. Non-reflective areas may be fashioned on reflective layer 150 along substantially the entire length of drum slot 140.

Figure 8:
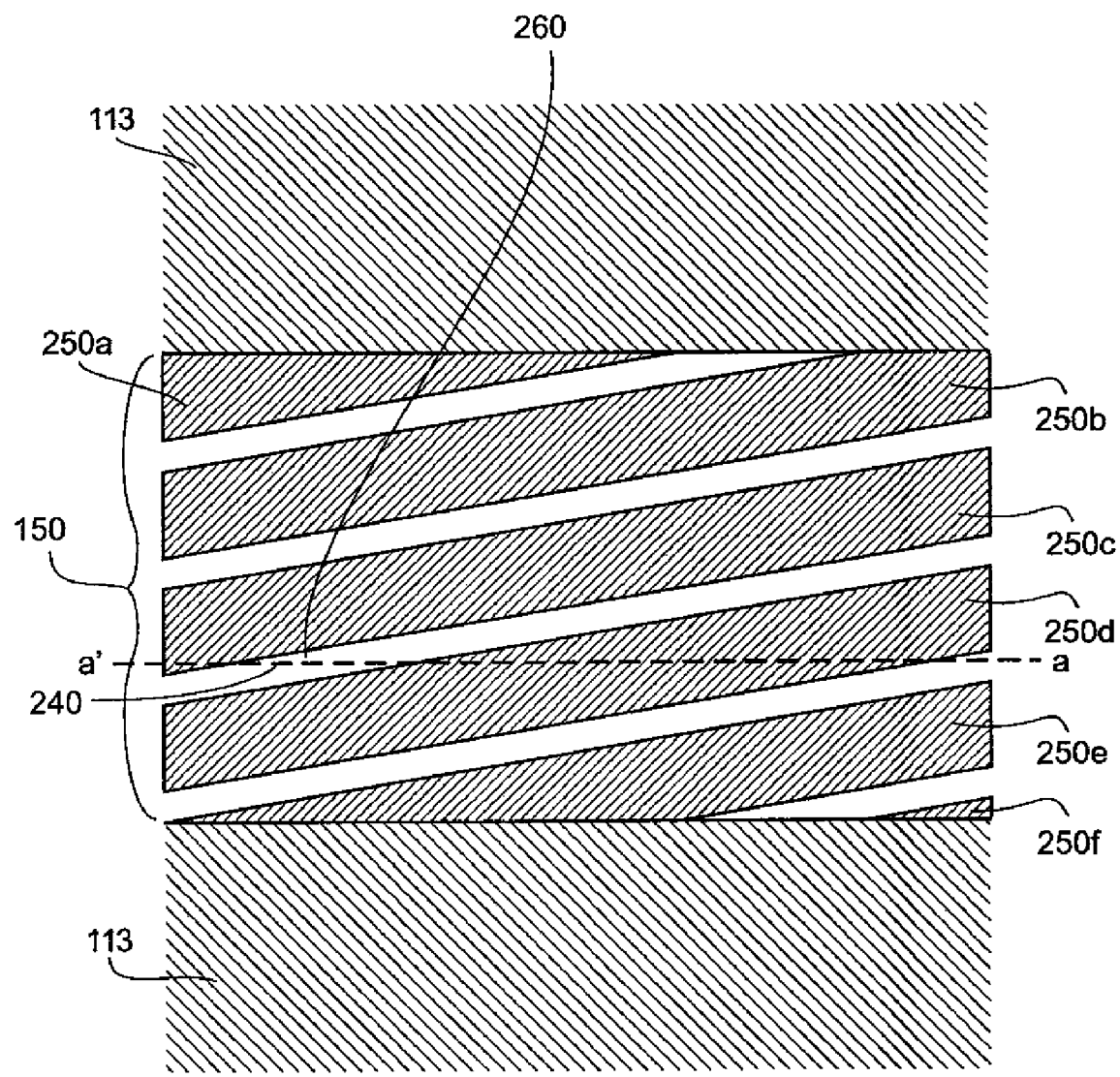
FIG. 8 is a plan view of the slot in the drum of a plate making machine.

In FIG. 8 an embodiment of the present invention shows a plan view of drum slot 140 of imaging drum 112 at second reference point 28B of FIG. 5, as illuminated by illumination source 105 (not shown). Non-reflective areas 250a, 250b, 250c, 250d, 250e, and 250f on reflective layer 150 have edges making very acute angles with perpendicular projection 240 of mechanical edge 200 of reference edge 15B of printing plate 14B, which protrudes over drum slot edge 111 of drum slot 140. In a more general case at least part of the perimeters of non-reflective areas 210a, 250a, 250b, 250c, 250d, 250e, and 250f are non-parallel with drum slot edge 111. In FIG. 8, printing plate 14B, reference edge 15B, and mechanical edge 200 are not shown for clarity and perpendicular projection 240, denoted by the line a-a', represents the circumferential location of mechanical edge 200 in the image of second reference point 28B. Similarly, clamp 130, that clamps printing plate 14B to cylindrical support surface 113 of imaging drum 112, as in FIG. 5, is not shown in FIG. 8 for the sake of clarity. Acute reflective apex 260, in this embodiment of the present invention, is very acute. Any circumferential repositioning of reference edge 15B, and thereby of perpendicular projection 240, will cause the position of acute reflective apex 260 to move by a large distance in the axial direction of imaging drum 112 along perpendicular projection 240. To ensure that there is always at least one acute reflective apex in the field of view of digital camera 40, non-reflective areas 250a, 250b, 250c, 250d, 250e, and 250f are fashioned in high density across drum slot 140 as shown in the circumferential direction of imaging drum 112. Since non-reflective areas 250a, 250b, 250c, 250d, 250e, and 250f have perimeters that are non-parallel with drum slot edge 111 and mechanical edge 200, a plurality of non-reflective areas 250a, 250b, 250c, 250d, 250e, and 250f will be crossed by perpendicular projection 240 as reference edge 15B is repositioned circumferentially with respect to imaging drum 112 (of FIG. 5) over drum slot 140. This results in an increased likelihood of an acute reflective apex 260 being located in the image obtained by digital camera 40. Additionally, the fact that acute reflective apex 260 is more acute in this embodiment of the present invention, allows a larger vicinity of acute reflective apex 260 to be employed in locating perpendicular projection 240, and, thereby, mechanical edge 200. This inherently increases the accuracy of the method.

In an embodiment of the present invention described in FIGS. 5, 11, 12, and 15, the selectable individual light source arrangement of FIGS. 11 and 12 is combined with a reflective layer 150 that has upon its surface facing digital camera 40 a plurality of non-reflective areas 255. For the sake of clarity, only one such non-reflective area 255 is numbered in FIG. 15. For the same reasons of clarity, the non-reflective areas are not shown in the region where drum slot edge shadow 115B exists. A plurality of acute reflective apexes 260A, 260B, 260C, and 260D are therefore created in the illuminated areas between perpendicular projection 240 and non-reflective areas 255. Also in this embodiment of the present invention the exact circumferential position of drum slot edge shadow 115B is adjustable via the choice of individual light source among 105A, 105B, 105C, 105D, 105E, and 105F as already explained above in FIG. 11 and FIG. 12. Various other individual light sources may be turned on or off to obtain a suitable balance between the silhouette of reference edge 15B of printing plate 14B on the one hand and to lower the amount of plate edge obscuring light on the other. This embodiment has the benefit of a simple drum slot arrangement whilst still providing a mechanism to control the amount of plate edge obscuring light.

Figure 16:
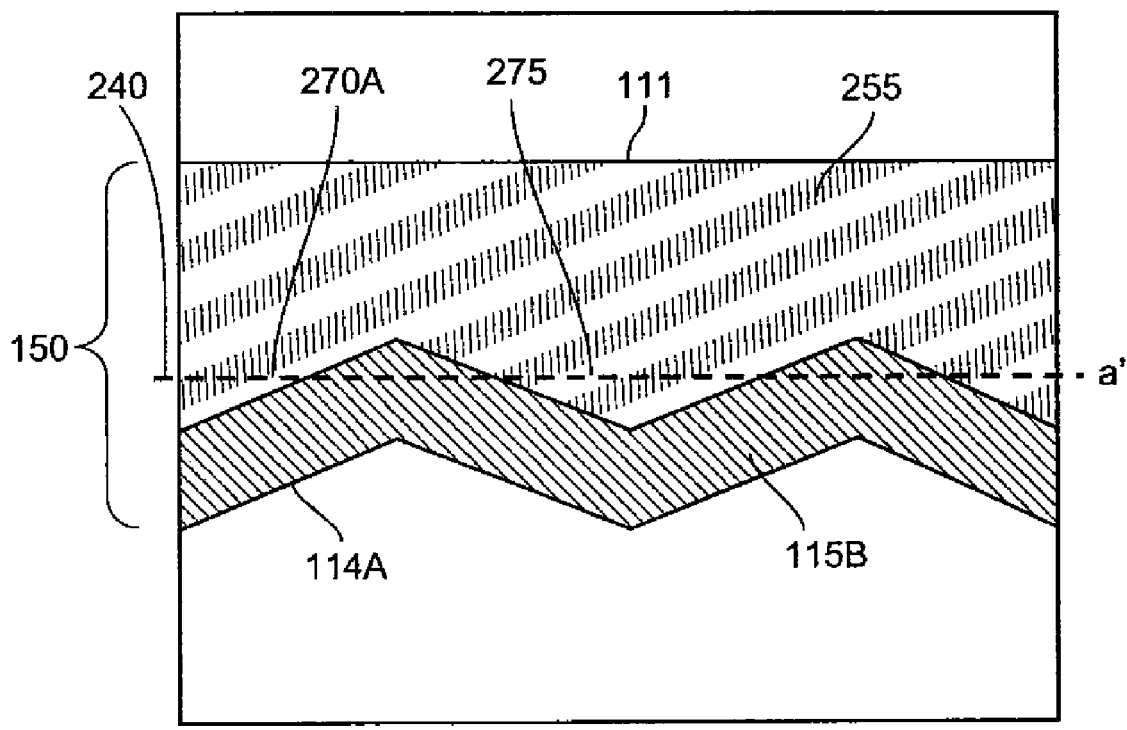
FIG. 16 is a schematic illustration of a region of a drum slot with a notched edge illuminated by a plurality of individual light sources in which the drum slot comprises a reflective layer having a plurality of non-reflective areas.

In an embodiment of the present invention, shown in FIG. 16 and discussed in FIGS. 5, 11, 12, and 16, the individual illumination source is selectable to thereby adjust the circumferential position of drum slot edge shadow 115B of drum slot edge 114A. Drum slot edge 114A (FIG. 16) is notched in a manner that creates a varying width for drum slot 140. In the example embodiment of FIG. 16, drum slot edge 114A is skewed to be non-parallel with drum slot edge 111 and mechanical edge 200. Reflective layer 150 has upon its surface facing digital camera 40 a plurality of non-reflective areas 255. For the sake of clarity, only one such non-reflective area 255 is numbered in FIG. 15. For the same reasons of clarity, the non-reflective areas are not shown in the region where drum slot edge shadow 115B exists. Two kinds of acute reflective apex are created by this approach. The first type, for example, acute reflective apex 270A in FIG. 16, is created between perpendicular projection 240 and drum slot edge drum slot edge shadow 115B of drum slot edge 114A. In a more general case, at least a part of the perimeter of shadow 115B is non-parallel with drum slot edge 111. The second type, acute reflective apex 275 in FIG. 16, is created between perpendicular projection 240 and non-reflective areas 255. Also in this embodiment of the present invention the exact circumferential position of drum slot edge shadow 115B is adjustable via the choice of individual light source among 105A, 105B, 105C, 105D, 105E, and 105F to employ as already explained above in FIG. 11 and FIG. 12. Various other individual light sources may be turned on or off to obtain a suitable balance between the silhouette of reference edge 15B of printing plate 14B on the one hand and to lower the amount of plate edge obscuring light on the other. This approach provides the benefit of having many reflective apexes to choose from and also provides a means to control the amount of plate edge obscuring light.

Both the use of reflective layer 150, that has upon its surface facing digital camera 40 non-reflective areas 255, and the use of notched drum slot edge 114, individually, in the various embodiments of the backlighting invention described in the present specification, provide at least one acute reflective apex, of which the perpendicular projection 240 of mechanical edge forms one side. The one class of embodiments does so by having non-reflective areas 255, for example, as part of reflective layer 150, while the other class of embodiments does so by creating areas of light or shadow, such as drum slot edge shadow 115, on reflective layer 150. Both classes of embodiments thereby turn reflective layer 150 into a source of light in the form of at least one acute apex light source when combined with reference edge 15B of printing plate 14B. The term "acute apex light source" is used in this specification to describe a source of light having an acute apex, examples being provided by acute reflective apex 230 in FIG. 7, acute reflective apex 260 in FIG. 8, acute reflective apex 270A, 270B, 270C, and 270D in FIG. 14, acute reflective apex 260A, 260B, 260C, and 260D in FIG. 15, and acute reflective apex 270A and 275 in FIG. 16. Irrespective of which mechanism is employed to obtain the acute apex light source of the present invention, the amount of plate edge obscuring light can be adjusted by the selection of an appropriate number of individual light sources 105A, 105B, 105C, 105D, 105E, and 105F, the additional individual light sources providing additional light in drum slot 140.

The present invention has been described in detail with particular reference to the imaging of printing plates. Various embodiments of the invention need not be limited to imaging printing plates but can include the formation of images on sheets of other recording media adapted for mounting on an imaging drum such as imaging drum 112. Such recording media can include various film media, for example.

PARTS LIST 10 plate-making machine (plate-setter)
11 third reference point

11' registration surface
12 imaging drum
13 cylindrical surface
14A printing plate
14B printing plate
15A reference edge
15B reference edge
16 imaging head
17 print image
17A edge of print image
18A registration pin
18B registration pin
18C registration pin
18A' registration surface of punching apparatus
18B' registration surface of punching apparatus
19A orthogonal edge
19B shorter edge
20 controller
21 reference point
22 memory
23 circumferential distance
24 sub-scan direction parallel to the axis of drum
25 region adjacent to reference edge 15
26 circumferential main-scan direction
27 print image data
28A first reference point
28B second reference point
40 digital camera
50 punching apparatus
52 punch table
62 press cylinder
101 carriage
103 lead screw
105 illumination source
105A individual light source
105B individual light source
105C individual light source
105D individual light source
105E individual light source
105F individual light source
110 plate-setter
111 drum slot edge
112 imaging drum
113 support surface
114 drum slot edge
114A drum slot edge
115 drum slot edge shadow
115B drum slot edge shadow
116 imaging head
117 print image
117A edge of print image
118A location surface
118B location surface
118C location surface
120 clamp
122 controller
123 drum controller
124 servo amplifier
130 clamp
135 drum brake
137 reference feature
140 drum slot
142 encoder
143 motor
145 drum zone
146 drum zone boundary
150 reflective layer
160 illuminating light beam
160A illuminating light beam
160B illuminating light beam
160C illuminating light beam
160D illuminating light beam
160E illuminating light beam
160F illuminating light beam
170 illumination baffle
180 reflected light
190 imaging aperture
200 mechanical edge
210a non-reflective area
210b non-reflective area
210c non-reflective area
220 reflecting region
230 acute reflective apex
240 perpendicular projection
250a non-reflective area
250b non-reflective area
250c non-reflective area
250d non-reflective area
250e non-reflective area
250f non-reflective area
255 non-reflective area
260 acute reflective apex
260A acute reflective apex
260B acute reflective apex
260C acute reflective apex
260D acute reflective apex
270A acute reflective apex
270B acute reflective apex
270C acute reflective apex
270D acute reflective apex
275 acute reflective apex
300 registering and imparting print image onto printing plate
302 mount plate
304 locate points on registration edge
306 determine required rotation (θ)
308 generate transformation
310 apply transformation
312 image plate
400 main-scan position calibration method
402 move imaging drum to a first incremental rotational position
404 operate drum brake to hold imaging drum stationary
406 determine calibration main-scan spacing between reference feature and at least one reference point
408 impart calibration image onto printing plate
410 determine calibration offset value
412 adjust calibration offset value in accordance with deviations from the calibration main-scan spacing in subsequently imaged printing plates

What is claimed is:

1. A method for determining a position of a mechanical edge of a reference edge of a sheet of recording media relative to a first edge of a drum slot in a cylindrical surface of an imaging drum, the method comprising:
   a) mounting the sheet of recording media on the imaging drum in an orientation wherein the reference edge extends along the cylindrical surface of the imaging drum in a substantially axial direction and wherein the reference edge extends over the first edge of the drum slot;
   b) establishing at least one acute reflective apex in the slot;
   c) capturing at least one digital camera image of the reference edge and the at least one acute reflective apex;

d) determining from the at least one digital camera image a location of at least one point on the mechanical edge; and wherein the establishing comprises illuminating a reflective layer in the slot using an illumination source and casting a shadow of a second edge of the drum slot on the reflective layer, at least part of the perimeter of the shadow being non-parallel with the first edge of the drum slot.

2. The method of claim 1, wherein the illumination source comprises a plurality of individual light sources and a position of the shadow is adjusted by selectively turning on one or more of the plurality of individual light sources.

3. The method of claim 1, wherein the illumination source comprises a plurality of individual light sources and an amount of plate edge obscuring light is adjusted by selectively turning on one or more of the plurality individual light sources.

4. An apparatus for determining a position of a mechanical edge of a reference edge of a sheet of recording media on an imaging drum comprising:
   a) the imaging drum comprising:
      i) a cylindrical surface;
      ii) a drum slot in the cylindrical surface, the drum slot extending in an axial direction and comprising a reflective layer;
   b) an illumination source for illuminating the drum slot;
   c) a digital camera for imaging the drum slot in a vicinity of the reference edge;
   d) a clamp for mounting the sheet of recording media on the imaging drum in an orientation wherein the reference edge extends along the cylindrical surface of the imaging drum in substantially the axial direction, the clamp configured for:
      i) mounting the recording media such that the reference edge extends over a first edge of the drum slot;
      ii) allowing the illuminating of the drum slot in a vicinity of the reference edge using the illumination source; and
      iii) allowing the capturing of at least one digital camera image of the drum slot in the vicinity of the reference edge by the digital camera; and
   e) wherein a second edge of the drum slot is skewed with respect to the first edge and the illumination source is configured to cast a shadow of the second edge of the drum slot on the reflective layer, at least part of the perimeter of the shadow being non-parallel with the first edge of the drum slot.

5. The apparatus of claim 4, wherein the illumination source comprises a plurality of individual light sources, the plurality of individual light sources configured to selectably cast different shadows of a second edge of the drum slot on the reflective layer.

6. The apparatus of claim 5, wherein the reflective layer comprises at least one non-reflective area, the non-reflective area having a perimeter that is non-parallel with the first edge of the drum slot.

* * * * *